US009845777B2

(12) United States Patent
Meyer et al.

(10) Patent No.: US 9,845,777 B2
(45) Date of Patent: Dec. 19, 2017

(54) CONFIGURABLE OUTPUT DRIVER ASIC

(71) Applicant: Cummins, Inc., Columbus, IN (US)

(72) Inventors: William D. Meyer, Columbus, IN (US); Meenal R. Vaidya, Columbus, IN (US); Rishvanth Kora Venugopal, Columbus, IN (US)

(73) Assignee: Cummins, Inc., Columbus, IN (US)

( * ) Notice: Subject to any disclaimer, the term of this patent is extended or adjusted under 35 U.S.C. 154(b) by 656 days.

(21) Appl. No.: 14/464,079

(22) Filed: Aug. 20, 2014

(65) Prior Publication Data
US 2016/0053730 A1 Feb. 25, 2016

(51) Int. Cl.
*F02M 51/00* (2006.01)
*H03K 19/177* (2006.01)
*F02D 41/20* (2006.01)

(52) U.S. Cl.
CPC .......... *F02M 51/005* (2013.01); *F02D 41/20* (2013.01); *F02D 41/2096* (2013.01); *H03K 19/17788* (2013.01); *F02D 2041/2003* (2013.01); *F02D 2041/2072* (2013.01)

(58) Field of Classification Search
CPC ... F02M 51/005; F02D 41/20; F02D 41/2096; F02D 41/2072; H03K 19/2003
See application file for complete search history.

(56) References Cited

U.S. PATENT DOCUMENTS

| | | | |
|---|---|---|---|
| 5,783,963 A | 7/1998 | Garnett et al. | |
| 7,059,304 B2 | 6/2006 | Manzone et al. | |
| 7,079,934 B2 | 7/2006 | Graf et al. | |
| 7,355,358 B2 | 4/2008 | Bliley et al. | |
| 7,612,512 B2 | 11/2009 | Loibl et al. | |
| 7,881,323 B2 | 2/2011 | Wong et al. | |
| 2007/0192017 A1* | 8/2007 | Bowling | F02D 41/2422 701/102 |
| 2014/0121846 A1 | 5/2014 | Dase | |
| 2014/0121946 A1* | 5/2014 | Viele | F02D 41/20 701/103 |
| 2015/0188328 A1* | 7/2015 | Abouda | H03K 17/063 123/478 |

OTHER PUBLICATIONS

"Tahmid's Blog: Using the high-low side drive IR2110—explanation and plenty of example circuits", Jan. 20, 2013, http://tahmidmc.blogspot.de/2013/01/using-high-low-side-driver-ir2110-with.html, 30 pages.
Deng, Beibei, "High Pressure Suspension Injector Electromagnetic Valve Drive Circuit IR2110 Design Application", Advanced Materials Research, vol. 588-589, Nov. 12, 2012, pp. 442-445.

(Continued)

*Primary Examiner* — Hieu T Vo
*Assistant Examiner* — Arnold Castro
(74) *Attorney, Agent, or Firm* — Foley & Lardner LLP

(57) ABSTRACT

A fuel system includes an electronic control module (ECM), at least one injector coupled to the ECM, and a configurable output driver circuit coupled to the at least one injector. The configurable output driver circuit includes a channel that enables adaptation of ECM outputs. The configurable output driver circuit is configurable based on a value stored in a register circuit.

22 Claims, 20 Drawing Sheets

(56) References Cited

OTHER PUBLICATIONS

Quinones, Jose, "Solenoid Driving with DRV8841/42", Application Report SLVA460, Mar. 2011, http://www.ti.com/lit/an/slva460/slva460.pdf, 9 pages.
Texas Instruments, "Dual H-Bridge Driver IC", Aug. 2013, http://www.ti.com/lit/ds/symlink/drv8841, 21 pages.
International Search Report and Written Opinion for International Application No. PCT/US2015/045677, dated Nov. 18, 2015, 15 pages.

* cited by examiner

CONFIGURABLE OUTPUT DRIVER ASIC

BACKGROUND

In automotive electronics, electronic control modules (ECMs) are a type of embedded system that control one or more of the electrical system(s) or subsystem(s) of a motor vehicle. A fuel system is conventionally controlled by an application-specific integrated circuit (ASIC), and output drivers are often controlled by ASIC pre-drivers. Conventional electronic control modules are designed for certain applications, and include different ASICs for different functions. When existing ECMs are considered for supporting alternate/new applications, these modules have output drivers that are often of the wrong types for what is required by the new application.

SUMMARY OF THE INVENTION

Disclosed herein are systems, methods, and computer-readable mediums for configurable output driver circuit that adapts the outputs of an electronic control module. One embodiment relates to a fuel system that comprises an electronic control module (ECM), at least one injector coupled to the ECM, and a configurable output driver circuit coupled to the at least one injector. The configurable output driver circuit includes a channel that enables adaptation of ECM outputs. The configurable output driver circuit is configurable based on a value stored in a register circuit.

Another embodiment relates to a configurable output driver circuit, which comprises a plurality of channels configured to drive at least one load, and at least one register configured to store configuration information for the plurality of channels, where the configuration information specifies a mode of operation for each of the plurality of channels. Each channel of the configurable output driver circuit comprises a high-side (HS) drive, a low-side (LS) drive, and a boost drive.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

The accompanying figures illustrate several embodiments of the invention and, together with the description, serve to explain the principles of the invention. One of ordinary skill in the art readily recognizes that the embodiments illustrated in the figures are merely exemplary, and are not intended to limit the scope of the present invention.

DETAILED DESCRIPTION

Figure 1:
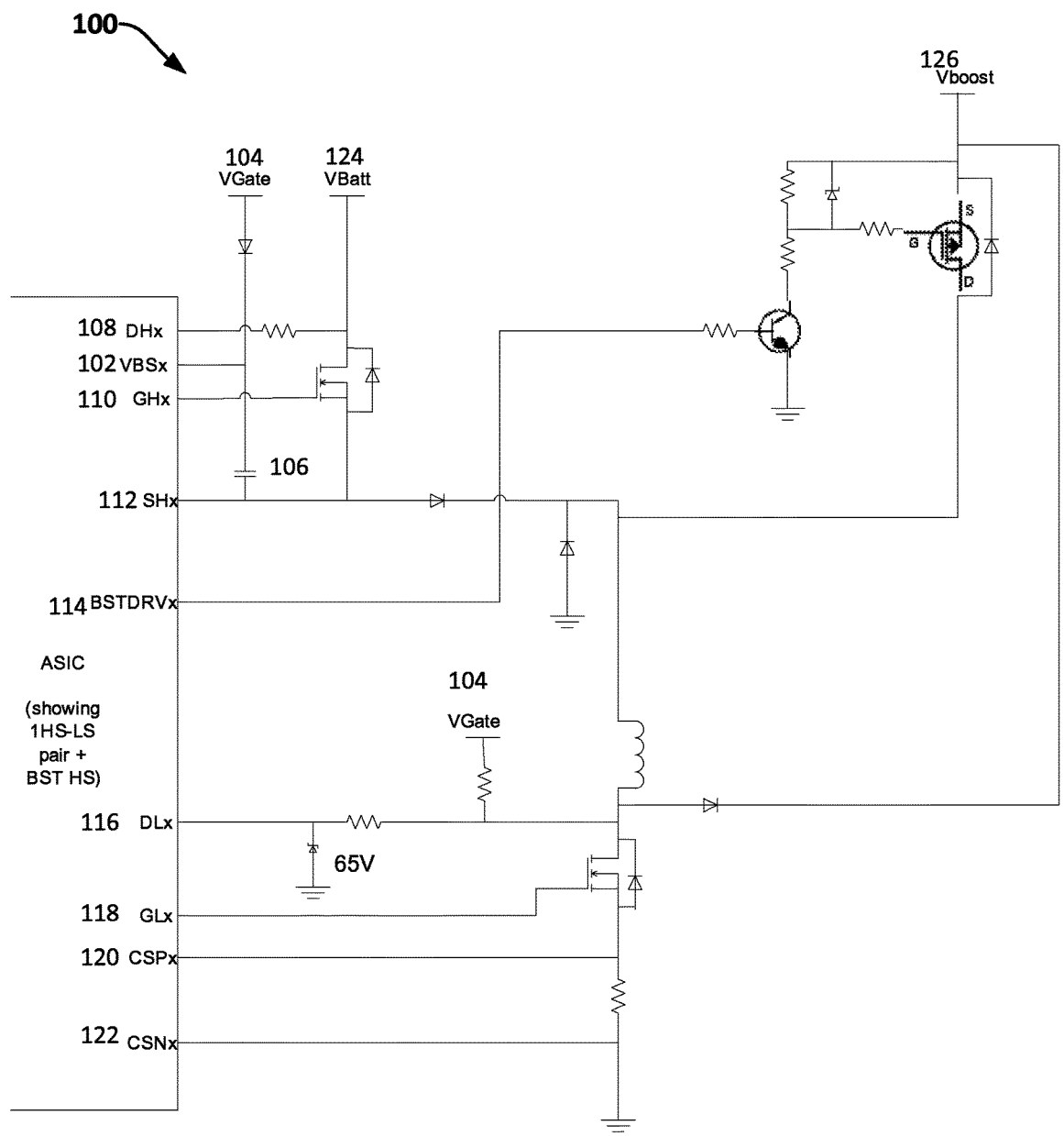
FIG. 1 illustrates a single channel of the configurable output driver (COD) ASIC, in accordance with one embodiment (a COD ASIC that utilizes a bootstrap capacitor).

The present invention relates to electronic control modules (ECMs), and more particularly, to creating configurable output driver circuits to adapt ECM outputs. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiments shown but is to be accorded the widest scope consistent with the principles and features described herein.

The methods and systems of the present disclosure provide configurable output driver circuits to enable adapting ECM outputs to actuators and motors of a motor vehicle. The configurable output driver (COD) circuits reduce the need for costly hardware redesigns, as different circuit configurations can be selected via a software (as opposed to a hardware) update, thereby improving system flexibility. Additionally, the configurable output driver circuits reduce ECM proliferation as the ECMs are reusable by various systems. The configurable output driver circuits also allow a common operating system software interface to reduce operating system (OS) development.

In a typical six cylinder engine application for controlling a fuel system, two COD ASICs are required (considering a 4 channel embodiment of a COD) to control the six injectors. However, in this configuration, there will be two spare channels. These two spare channels can be used to drive two more injector-like loads or can be combined to form an HBridge and drive a motor. Alternatively, the spare channels can be used separately as high-side only or low-side only drivers (i.e., 4 independent drivers) to drive loads like lamps, relays, etc. The configuration of the channels of the COD ASIC can be managed by software (e.g., via serial peripheral interface (SPI) writes to registers of the COD ASIC). For example, various register values may be stored to select different configuration modes of the COD ASIC. In one embodiment, a string of bits may be stored and used to select a mode of the COD ASIC. Other formats and register values may also be used. Registers may also be used to store configuration codes for individual channels of the COD ASIC.

The COD ASIC disclosed herein offers flexibility via such configurable registers, and an ECM that is coupled to the COD ASIC can be designed to take advantage of this flexibility. Thus, a fuel system that includes such an ECM (e.g., an ECM coupled to an injector of the fuel system, etc.) can use the disclosed COD ASIC to adapt the ECM outputs. The adapted ECM outputs can then drive various loads.

Each of the COD ASIC's channels consist of a high-side (HS)/low-side (LS) pair and at least one boost drive (e.g., an external p-Channel field-effect transistor (PFET) drive according to one embodiment). The COD ASIC can support a varying number of channels, including, but not limited to, 4 channels. The HS/LS pair can drive various types of loads. In one embodiment, the HS/LS pair can drive an un-boosted voltage Injector type (solenoid) load or an ON-OFF type load. In another embodiment, the HS/LS pair, when combined with the digital Boost control signal (e.g., shown as generated by a PFET drive), can also drive a boosted voltage Injector-type (solenoid) load. The boosted voltage option is useful when an application needs a solenoid to open quickly. Multiple channels of HS/LS pairs can also work in conjunction to form a variety of drivers including, but not limited to, an HBridge (HB) driver, a brushless motor (BM) driver, and an independent High-Side (HS) driver or Low-Side (LS) driver.

FIG. 1 illustrates a single channel 100 of the COD ASIC in accordance with an embodiment. In FIG. 1, the single channel 100 is implemented with a bootstrap capacitor and includes a bootstrap capacitor pin VBSx 102, external voltage source VGate 104, and an external capacitor 106 to create the drive required for the High-Side (HS) Gate. DHx 108 represents the drain of a High-Side FET; GHx 110 represents a gate of the High-Side FET; SHx 112 represents a source of the High-Side FET; BSTDRVx 114 represents a digital control signal for boost drive, shown driving an external PFET; DLx 116 represents a drain for a Low-Side FET; GLx 118 represents a gate of the Low-Side FET; CSPx 120 represents that a current sense is positive; and CSNx 122 represents that a current sense is negative. The suffix x is used to denote a channel number, and each channel of the COD ASIC includes the pins depicted in FIG. 1.

In FIG. 1, VBatt 124 may include a variety of source voltages. In one embodiment, VBatt includes, but is not limited to, 12V or 24V where the range of 6V to 36V represents an operating range. An absolute max voltage may also be specified. For example, an absolute max voltage may be 55V for 500 milliseconds. Vgate 104 can be a variety of voltages including, but not limited to, the range of 5V to 15V. Vboost 126 can be a variety of voltages including, but not limited to, the range of 70V to 130V where 130V is modulated and 70V is non-modulated. Other voltage configurations for channel 100 may also be utilized.

Figure 2:
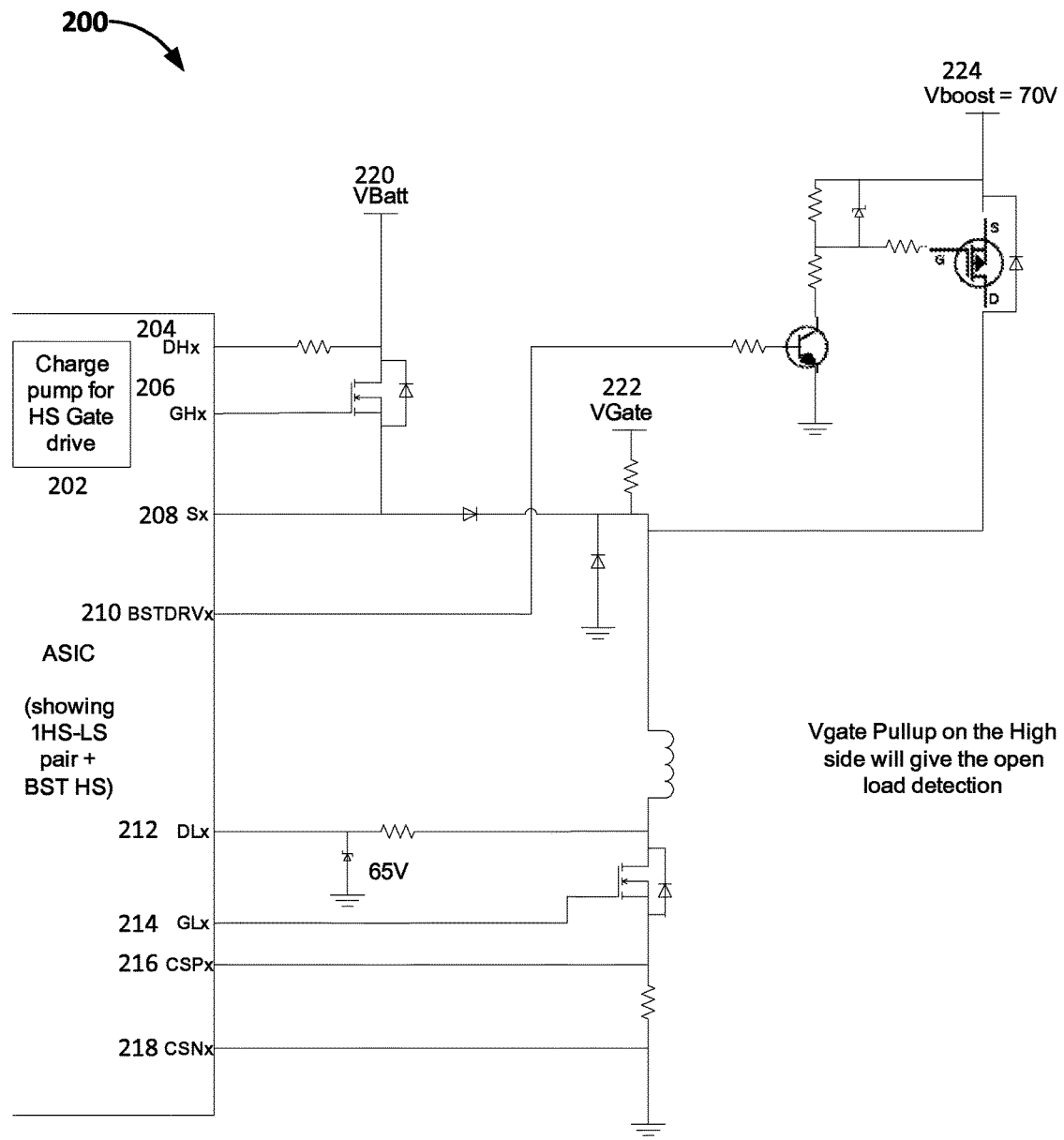
FIG. 2 illustrates a single channel of the COD ASIC, in accordance with one embodiment (a COD ASIC that utilizes a charge pump).

FIG. 2 illustrates a single channel 200 of the COD ASIC in accordance with an embodiment. In FIG. 2, the single channel 200 is implemented with a charge pump 202 to create the drive required for the High-Side Gate. Any commercially available charge pump 202 may be used. DHx 204 represents the drain of a High-Side FET; GHx 206 represents a gate of the High-Side FET; SHx 208 represents a source of the High-Side FET; BSTDRVx 210 represents a digital control signal for boost drive, shown driving an external PFET; DLx 212 represents a drain for a Low-Side FET; GLx 214 represents a gate of the Low-Side FET; CSPx 216 represents that a current sense is positive; and CSNx 218 represents that a current sense is negative. The suffix x represents a channel number and each channel of the COD ASIC includes all pins shown in FIG. 2.

Similar to VBatt 124 in FIG. 1, Vbatt 220 can provide a variety of voltages including, but not limited to, 12V or 24V, where 6V to 36V represents an operating range. An absolute max voltage may be 55V for 500 milliseconds. Vboost 224 can be a variety of voltages including, but not limited to, the range of 70V to 130V, where 130V is modulated and 70V is non-modulated. Additionally, a gate drive Vgate 222 for the battery High-Side FET can be a variety of voltages including, but not limited to, the range of 5V to 15V. The Vgate 222 pullup on the high side supports open load detection.

Table 1 below shows examples of how channels of the COD ASIC can be configured to support various configurations and associated modes of operation.

TABLE 1

| Channels | Drive | Column 1 Boosted Solenoid Option | Column 2 High Side Low Side Pair | Column 3 High Side Low Side Pair + HBridge (Full-bridge) | Column 4 HBridge (Full-bridge) | Column 5 Brushless Motor + High Side Low Side Pair |
|---|---|---|---|---|---|---|
| Channel 1 | Boost HS1 LS1 | Solenoid 1 (boosted) (Mode 1) | Solenoid 1 (Mode 2 or 3) | Solenoid 1 (boost optional) (Mode 1, 2, or 3) | HBridge | Solenoid 1 (boost optional) (Mode 1, 2, or 3) |
| Channel 2 | Boost HS2 LS2 | Solenoid 2 (boosted) (Mode 1) | Solenoid 2 (Mode 2 or 3) | Solenoid 2 (boost optional) (Mode 1, 2, or 3) | | BM |

TABLE 1-continued

| Channels | Drive | Column 1 Boosted Solenoid Option | Column 2 High Side Low Side Pair | Column 3 High Side Low Side Pair + HBridge (Full-bridge) | Column 4 HBridge (Full-bridge) | Column 5 Brushless Motor + High Side Low Side Pair |
|---|---|---|---|---|---|---|
| Channel 3 | Boost HS3 LS3 | Solenoid 3 (boosted) (Mode 1) | Solenoid 3 (Mode 2 or 3) | HBridge | HBridge | |
| Channel 4 | Boost HS4 LS4 | Solenoid 4 (boosted) (Mode 1) | Solenoid 4 (Mode 2 or 3) | | | |

As depicted in Table 1, each of the four channels includes 3 drives: a digital control signal for Boost (depicted driven by the PFET), a High-Side (HS) drive, and a Low-Side (LS) drive. The High-Side (HS) and the Low-Side (LS) form a High-Side (HS)/Low-Side (LS) pair. The COD ASIC works in any of the configurations in Table 1 by changing ASIC configuration registers that store various configuration mode information, and by changing the external circuitry (e.g. field-effect transistors FETs and sense resistors) per the configuration chosen. A solenoid load can be driven boosted or unboosted in Mode 1, Mode 2, or Mode 3. Mode 2 is similar to Mode 1, but includes an external control signal rather than a current sense based feedback control. Column 1 and Column 2 display channel configurations that support Modes 1-3. The configurations include additional Modes 4-6.

Mode 5 represents an HBridge and requires combining two channels. In a 4 channel device, the remaining two channels can be combined to create a second HBridge driver (this configuration is shown in Column 4 of Table 1). Additionally, each channel of the 4 channel device can drive a solenoid load in Modes 1-3 (this configuration is shown in Column 3 of Table 1). Mode 6 represents a configuration for a brushless motor and requires combining of three channels. In a 4 channel device, the remaining channel can drive a solenoid load in Modes 1-3 (this configuration is shown in Column 5 of Table 1).

A 3 channel version of the COD ASIC is represented by Table 2 below. Table 2 below shows how the channels of the 3 channel COD ASIC can be configured to support different configurations and associated modes of operation.

TABLE 2

| Channels | Drive | Column 1 Boosted Solenoid Option | Column 2 High Side Low Side Pair | Column 3 High Side Low Side Pair + HBridge (Full-bridge) | Column 4 Brushless Motor + High Side Low Side Pair |
|---|---|---|---|---|---|
| Channel 1 | Boost HS1 LS1 | Solenoid 1 (boosted) (Mode 1) | Solenoid 1 (Mode 2 or 3) | HBridge | BM |
| Channel 2 | Boost HS2 LS2 | Solenoid 2 (boosted) (Mode 1) | Solenoid 2 (Mode 2 or 3) | | |
| Channel 3 | Boost HS3 LS3 | Solenoid 3 (boosted) (Mode 1) | Solenoid 3 (Mode 2 or 3) | Solenoid 1 (boost optional) (Mode 1, 2, or 3) | |

In Table 2, each of the three channels includes 3 drives: a Boost, a High-Side (HS), and a Low-Side (LS). The COD ASIC can work in any of the configurations of Table 2 by changing ASIC registers and changing the external circuitry (e.g. field-effect transistors FETs and sense resistors) based on the configuration chosen. A solenoid load can be driven boosted or unboosted in Mode 1, Mode 2, or Mode 3. Mode 2 is similar to Mode 1 but includes an external control signal rather than a current sense based feedback control. Column 1 and Column 2 display channel configurations that support Modes 1-3. The configurations may include additional Modes 4-6.

Mode 5 represents an HBridge and requires combining two channels. In a 3 channel device, the remaining channel can drive a solenoid load in Modes 1-3 (this configuration is shown in Column 3 of Table 2). Mode 6 represents a configuration for a brushless motor and requires combining of all three channels. When using this mode (in a 3 channel device) there is no spare channel, and therefore, no other mode of operation is supported.

Figure 3A:
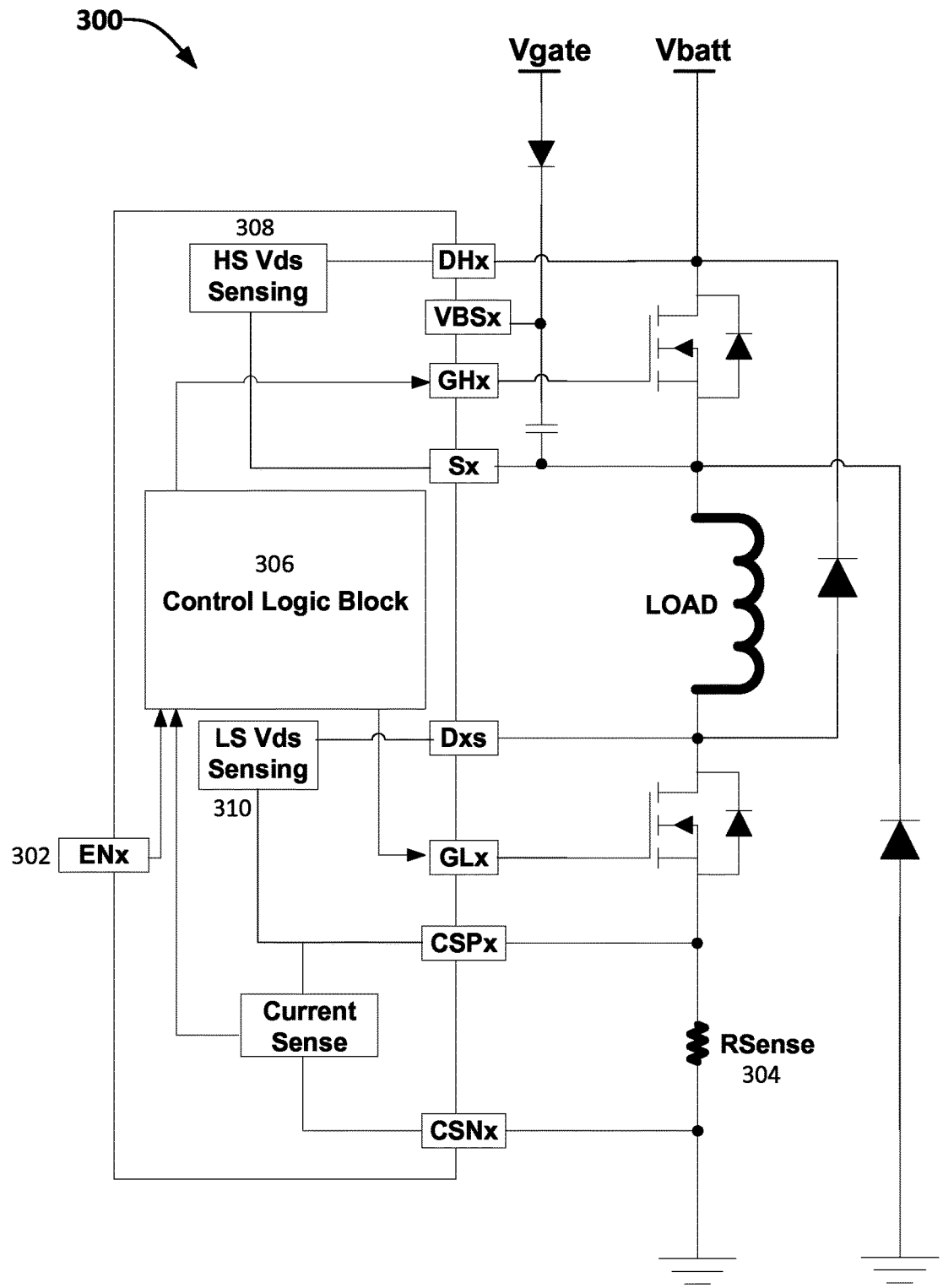
FIG. 3A illustrates circuitry for Mode 1 (HS-LS Pair or Half Bridge) of the COD ASIC that utilizes a bootstrap capacitor, in accordance with one embodiment.
Figure 3B:
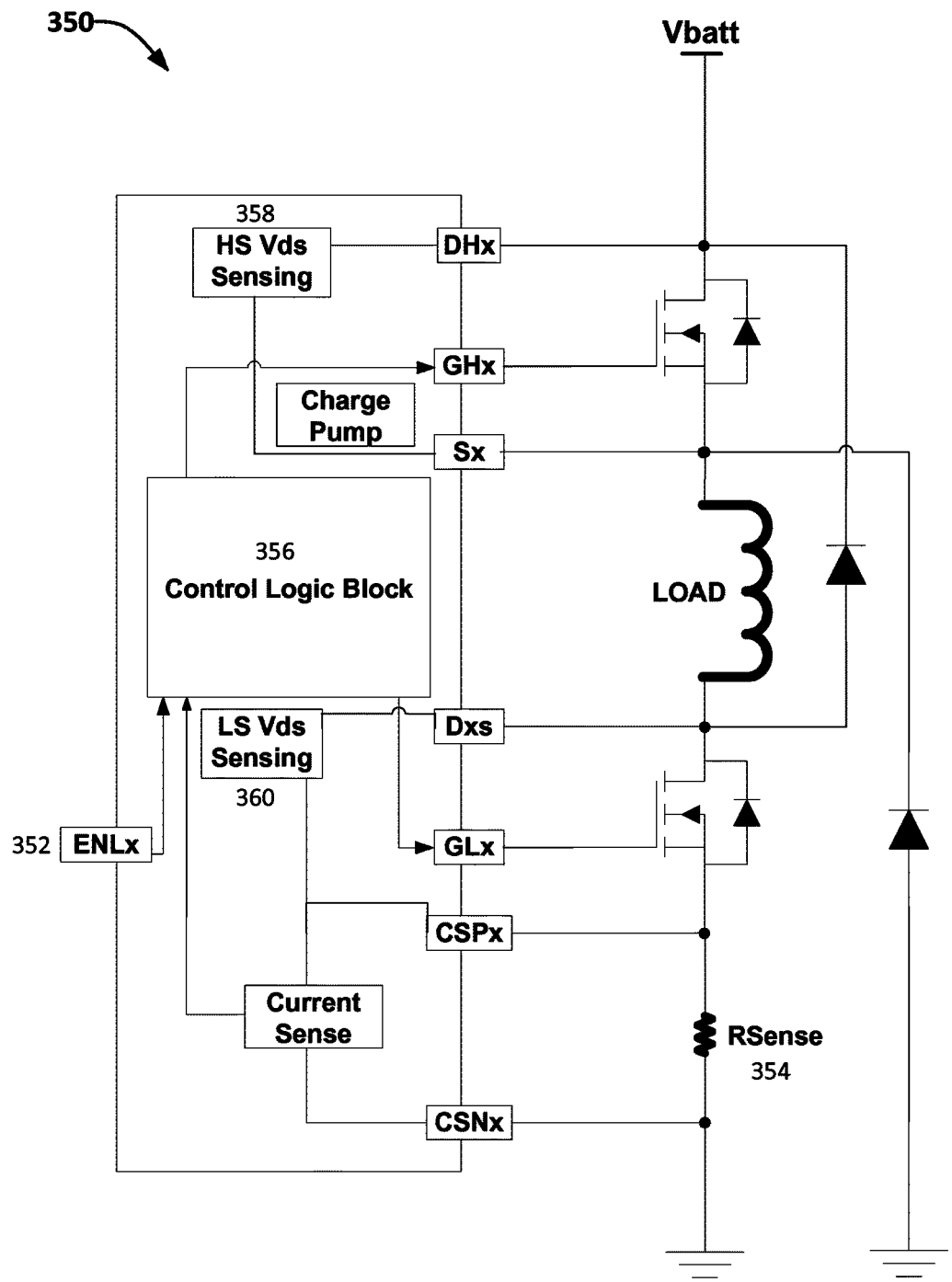
FIG. 3B illustrates circuitry for Mode 1 (HS-LS Pair or Half Bridge) of the COD ASIC that utilizes a charge pump, in accordance with one embodiment.

FIG. 3A illustrates circuitry 300 for Mode 1 (HS-LS Pair or Half Bridge) of the COD ASIC that utilizes a bootstrap capacitor. FIG. 3B illustrates circuitry 350 for Mode 1 (HS-LS Pair or Half Bridge) of the COD ASIC that utilizes a charge pump. The various abbreviations (e.g. DHx, etc.) denoted in FIGS. 3A and 3B represent the same elements (e.g. DHx, etc.) as described in FIGS. 1 and 2. Mode 1 can drive a solenoid load with a High-Side and a Low-Side FET.

In FIGS. 3A/3B, an enable signal ENx 302/ENLx 352 enables the channel, which in turn switches the High-Side and the Low-Side FETs to turn on via the HS Vds Sensing module 308/358 and the LS Vds Sensing modules 310/360, respectively. A current sense resistor Rsense 304/354 senses a load current, and this feedback coupled with a control logic block 306/356 controls the High-Side Gate. When the ENx/ENLx signal becomes low (e.g., 0V or another defined logic low voltage), both the High-Side and the Low-Side FETs turn off.

Figure 4A:
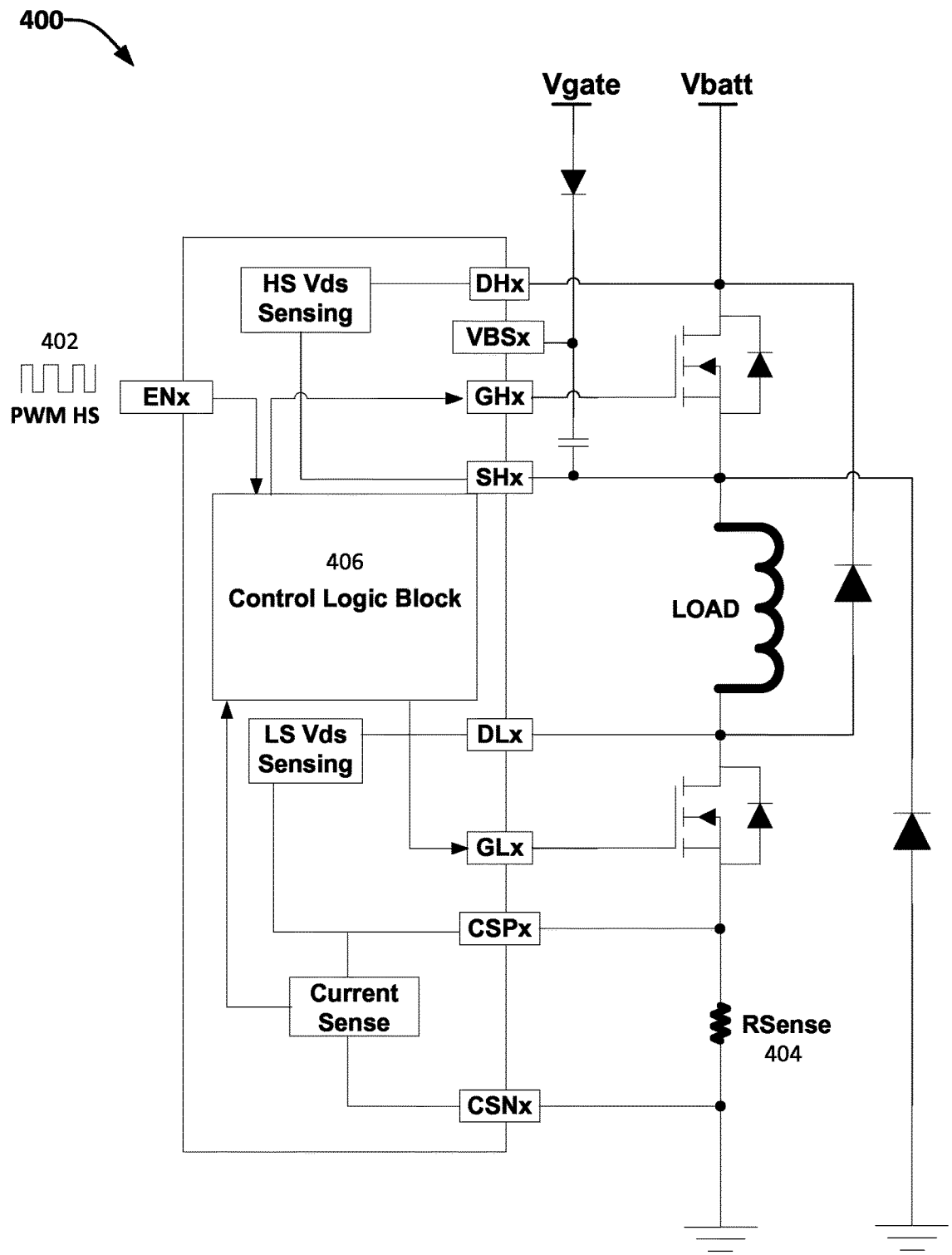
FIG. 4A illustrates circuitry for Mode 2 (HS PWM, LS On-Off) of the COD ASIC that utilizes a bootstrap capacitor, in accordance with one embodiment.
Figure 4B:
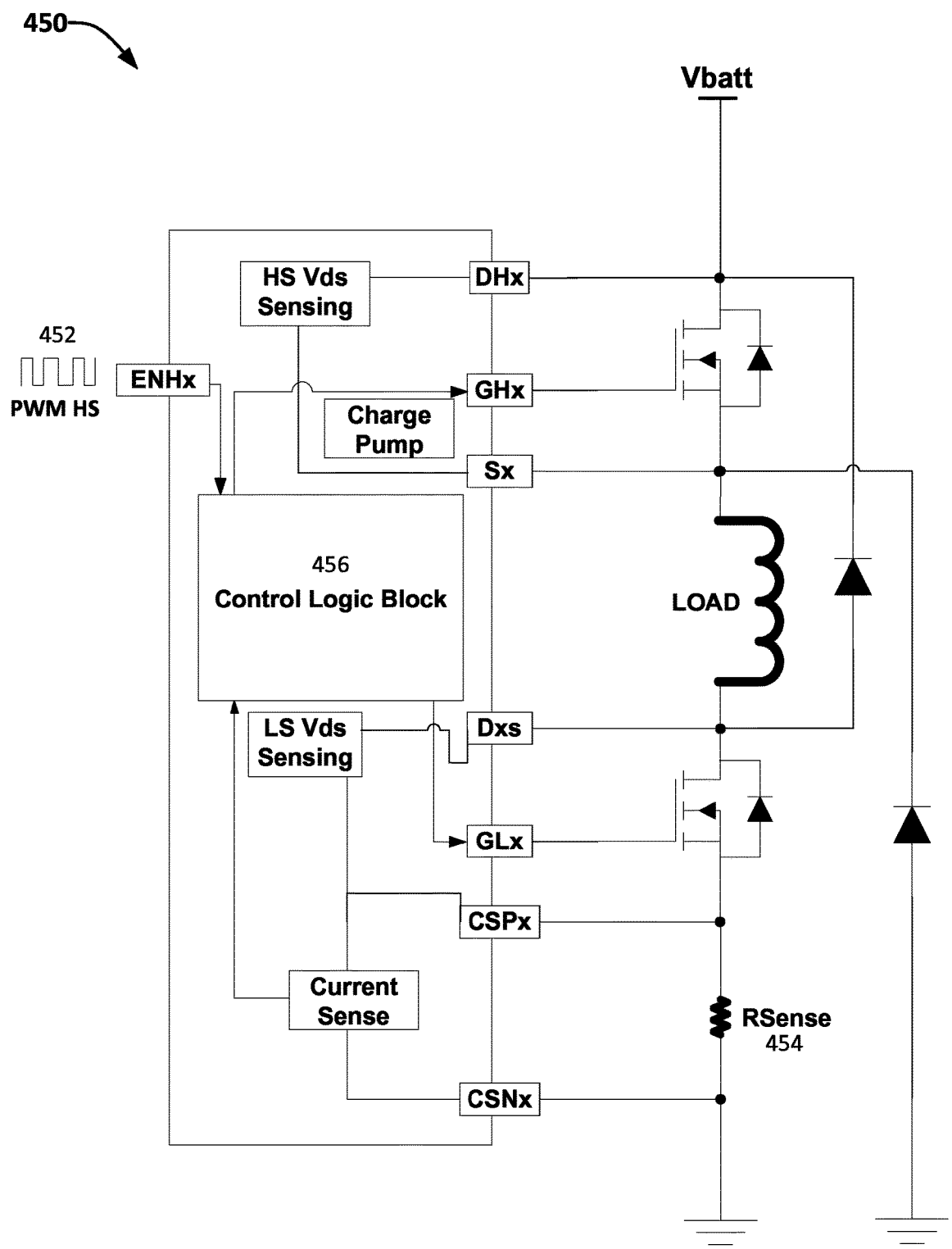
FIG. 4B illustrates circuitry for Mode 2 (HS PWM, LS On-Off) of the COD ASIC that utilizes a charge pump, in accordance with one embodiment.

FIG. 4A illustrates circuitry 400 for Mode 2 (HS Pulse-width Modulation PWM, LS On-Off) of the COD ASIC that utilizes a bootstrap capacitor. FIG. 4B illustrates circuitry 450 for Mode 2 (HS PWM, LS On-Off) of the COD ASIC that utilizes a charge pump. The various abbreviations (e.g. DHx, etc.) denoted in FIGS. 4A and 4B represent the same elements (e.g. DHx, etc.) as the ones described for FIGS. 1-3. Mode 2 can drive a solenoid load with a High-Side and a Low-Side FET.

In FIGS. 4A/4B, a control logic block 406/456 switches the Low-Side FET on. An enable signal ENx 402/ENHx 452 is controlled by an external control circuit and directly drives the High-Side FET. A current sense resistor RSense 404/454 limits a load current. The control logic block 406/456 switches both the High-Side and the Low-Side FETs off if current exceeds a programmed limit. For example, if a peak current limit is set to 8 Amps, and the current exceed this limit, then the High-Side FETs would be turned off. This limit could be stored using a register or other memory.

Figure 5A:
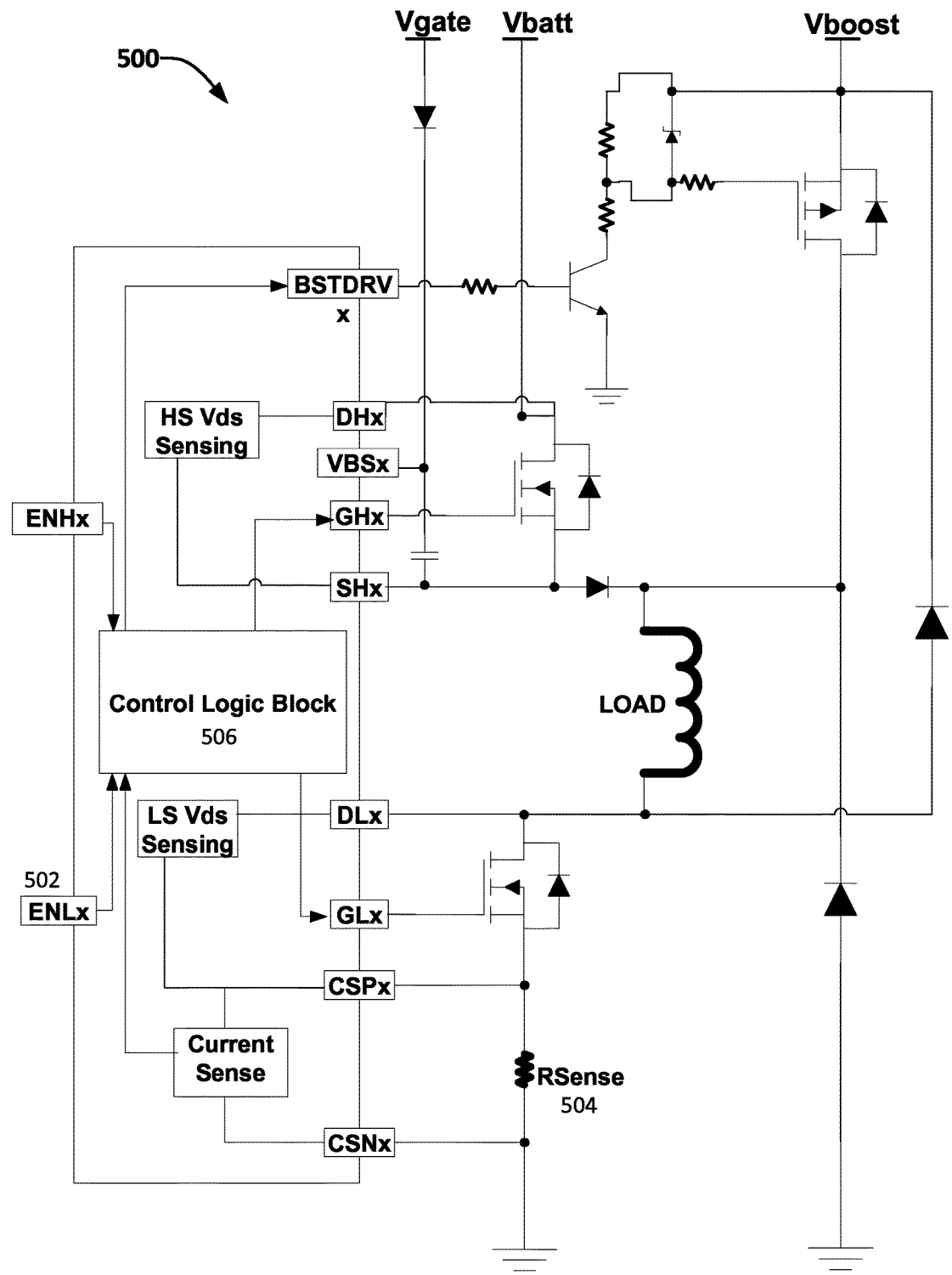
FIG. 5A illustrates circuitry for Mode 3 (HS-LS Pair with Boost) of the COD ASIC that utilizes a bootstrap capacitor, in accordance with one embodiment.
Figure 5B:
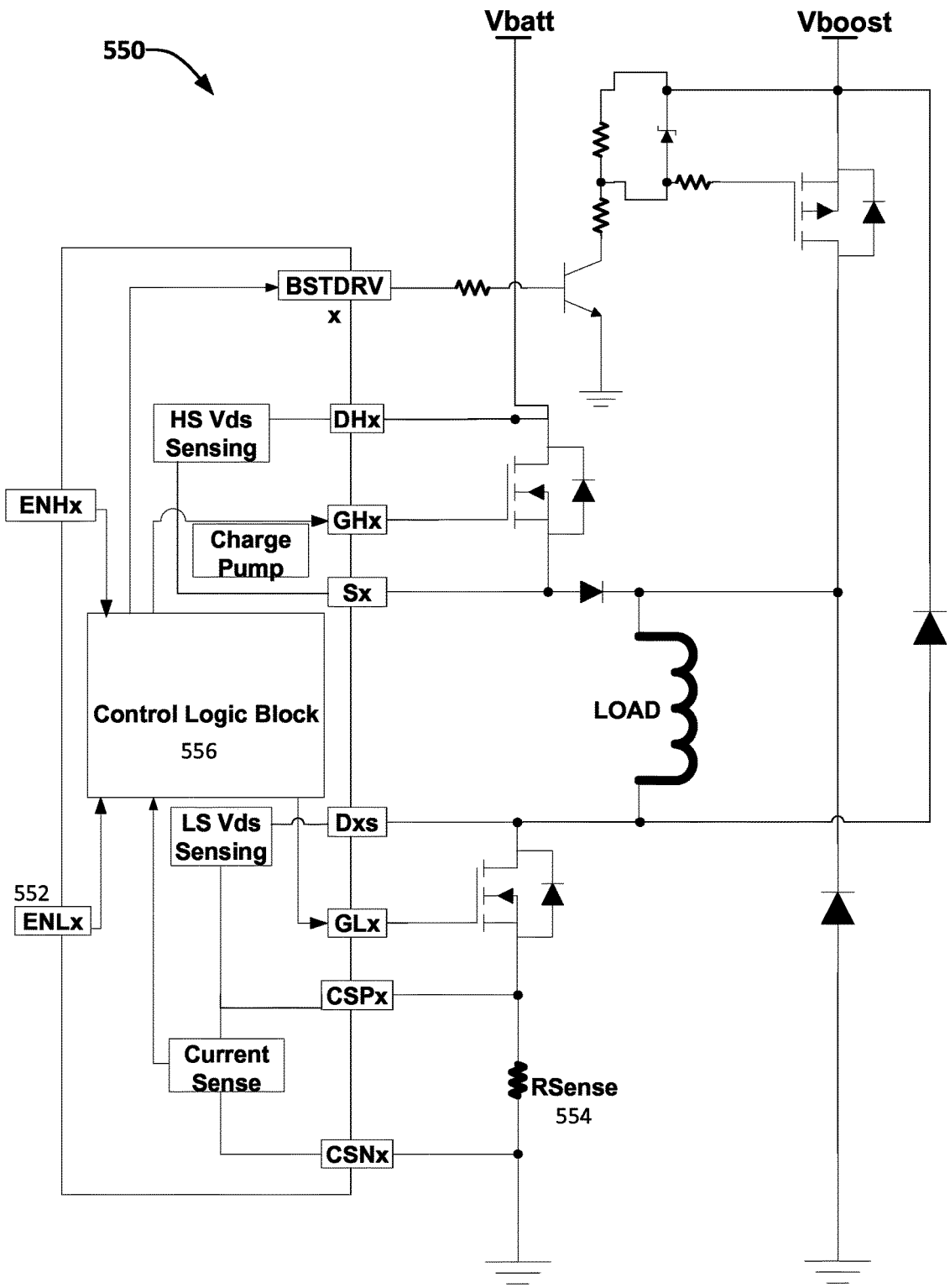
FIG. 5B illustrates circuitry for Mode 3 (HS-LS Pair with Boost) of the COD ASIC that utilizes a charge pump, in accordance with one embodiment.

FIG. 5A illustrates circuitry 500 for Mode 3 (HS-LS Pair with Boost) of the COD ASIC that utilizes a bootstrap capacitor. FIG. 5B illustrates circuitry 550 for Mode 3 (HS-LS Pair with Boost) of the COD ASIC that utilizes a charge pump. The various abbreviations (e.g. DHx, etc.) denoted in FIGS. 5A and 5B represent the same elements (e.g. DHx, etc.) as described for FIGS. 1-3. Mode 3 can drive a solenoid load with a High-Side FET, a boost drive (shown as PFET drive), and a Low-Side FET.

In FIGS. 5A/5B, an enable signal ENx 502/ENLx 552 enables the channel, which in turn switches the Low-Side FET on, switches the BSTDRVx for the PFET on, and switches the High-Side FET on. In some applications a second enable signal ENHx can be used to control the High-Side FET. The BSTDRVx operation may operate in either a simple boost mode or a modulated boost mode. A current sense resistor RSense 504/554 senses a load current, and this feedback coupled with a control logic block 506/556 control the High-Side Gate. When the ENx/ENLx signal becomes logically low (e.g., zero), the High-Side FET, the Low-Side FET, and the BSTDRVx all turn off.

Figure 6A:
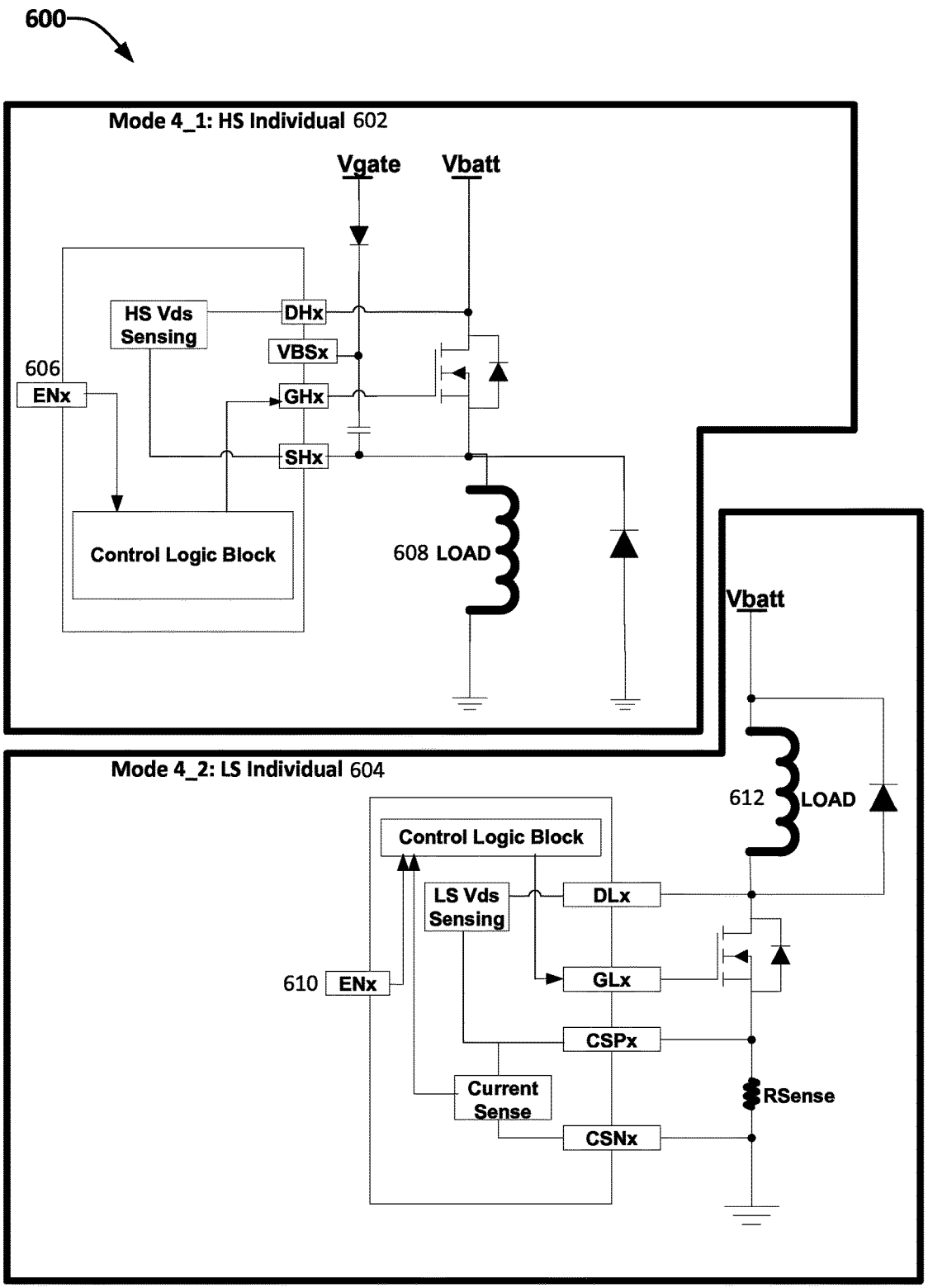
FIG. 6A illustrates circuitry for Mode 4 (HS Individual, LS Individual) of the COD ASIC that utilizes a bootstrap capacitor, in accordance with one embodiment.
Figure 6B:
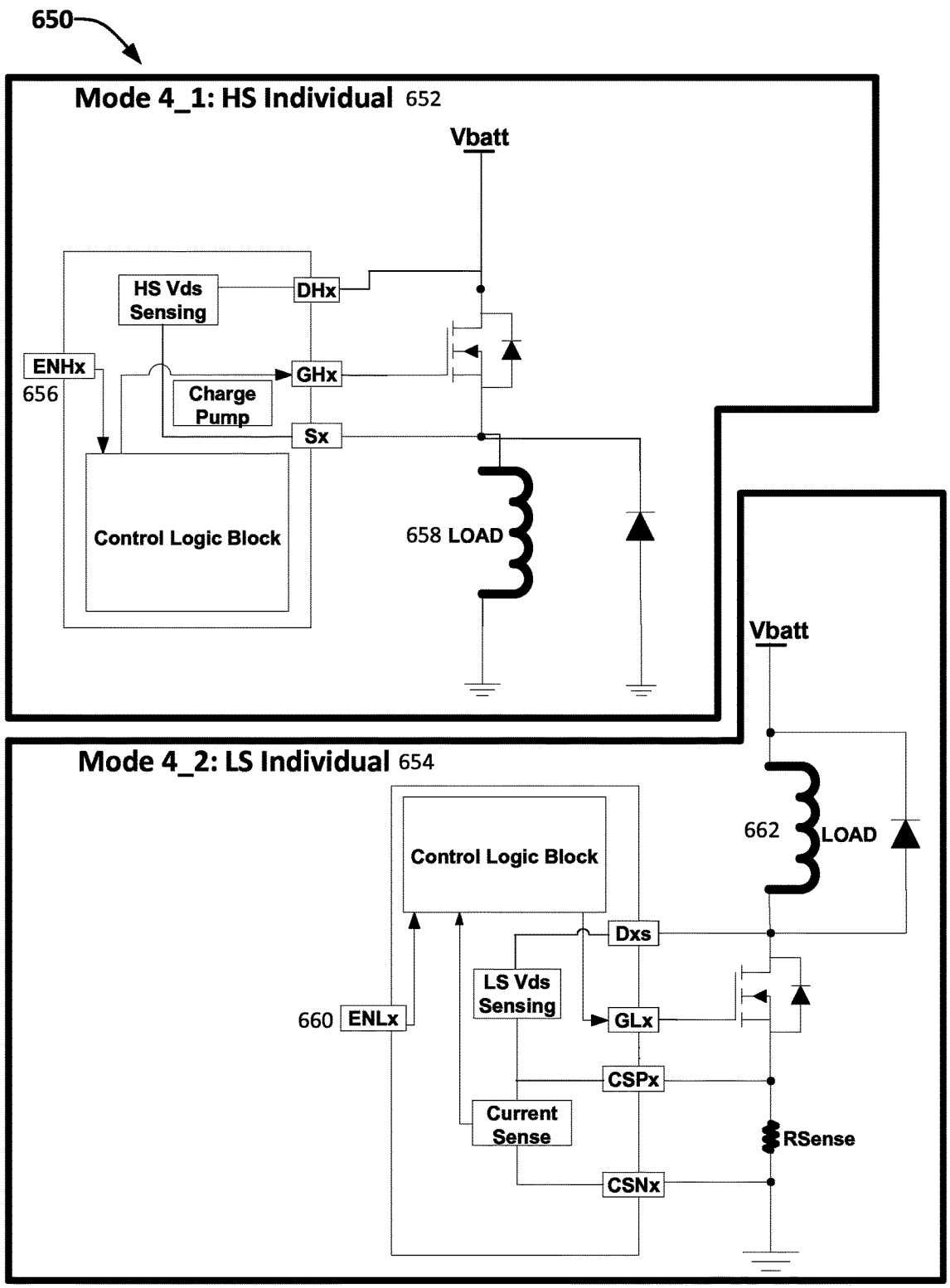
FIG. 6B illustrates circuitry for Mode 4 (HS Individual, LS Individual) of the COD ASIC that utilizes a charge pump, in accordance with one embodiment.

FIG. 6A illustrates circuitry 600 for Mode 4 (HS Individual 602, LS Individual 604) of the COD ASIC and utilizes a bootstrap capacitor. FIG. 6B illustrates circuitry 550 for Mode 4 (HS Individual 652, LS Individual 654) of the COD ASIC and utilizes a charge pump. The various abbreviations (e.g. DHx, etc.) denoted in FIGS. 6A and 6B represent the same elements (e.g. DHx, etc.) as described for FIGS. 1-3. Mode 4 supports two independent loads using the High-Side FET and the Low-Side FET.

In the HS Individual 602 diagram of FIG. 6A, an enable signal ENx 606 enables the High-Side FET to drive a load 608, which is connected between High-Side FET and ground. In the LS Individual 604 diagram of FIG. 6B, an enable signal ENx 610 enables the Low-Side FET to drive a load 612, which is connected between Vbatt and the Low-Side FET. In the HS Individual 652 diagram of FIG. 6B, an enable signal ENHx 656 enables the High-Side FET to drive a load 658, which is connected between High-Side FET and ground. In the LS Individual 654 diagram of FIG. 6B, an enable signal ENLx 660 enables the Low-Side FET to drive a load 662, which is connected between Vbatt and the Low-Side FET.

Figure 7A:
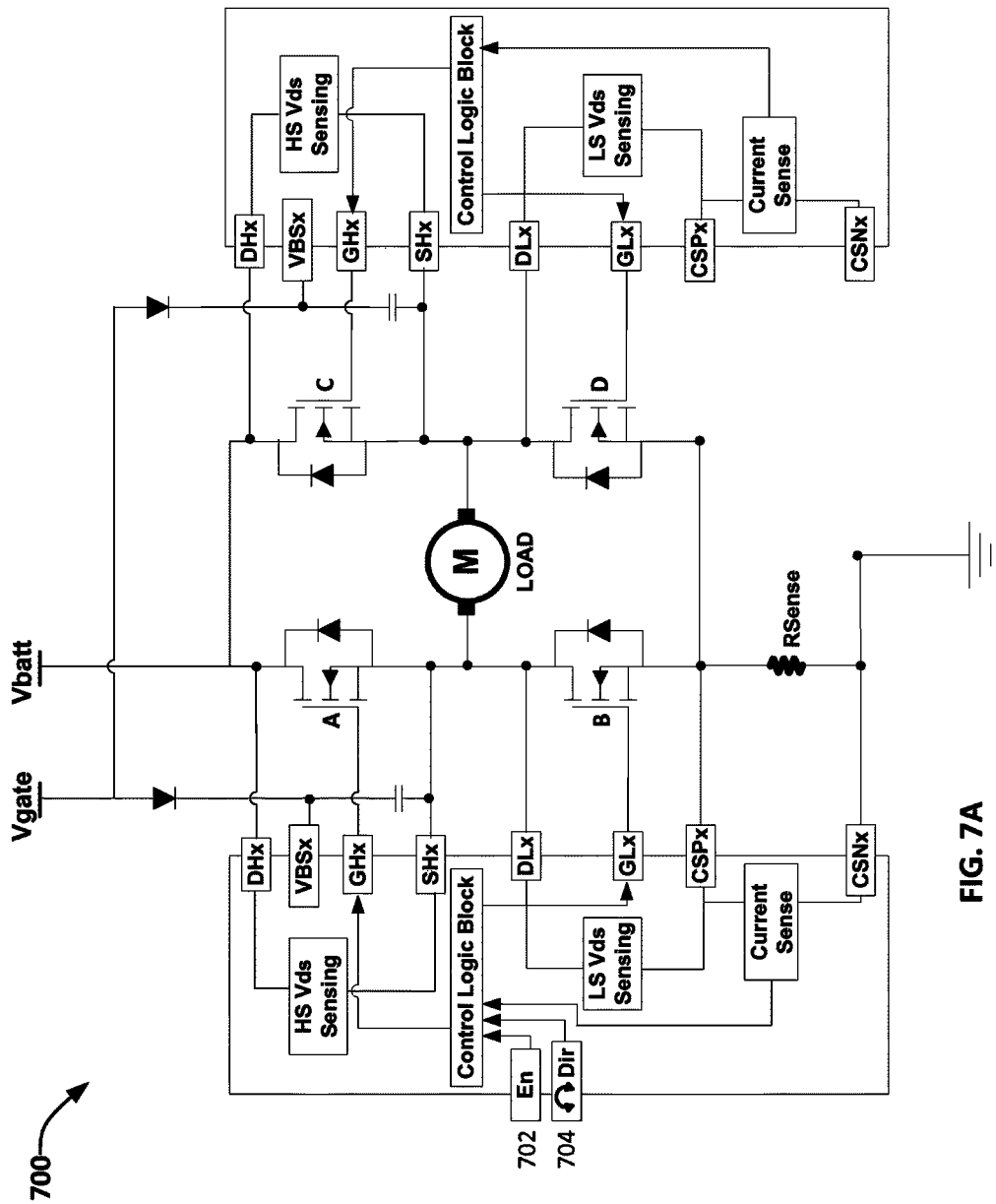
FIG. 7A illustrates circuitry for Mode 5 (HBridge) of the COD ASIC that utilizes a bootstrap capacitor, in accordance with one embodiment. This mode combines two channels of the COD ASIC.
Figure 7B:
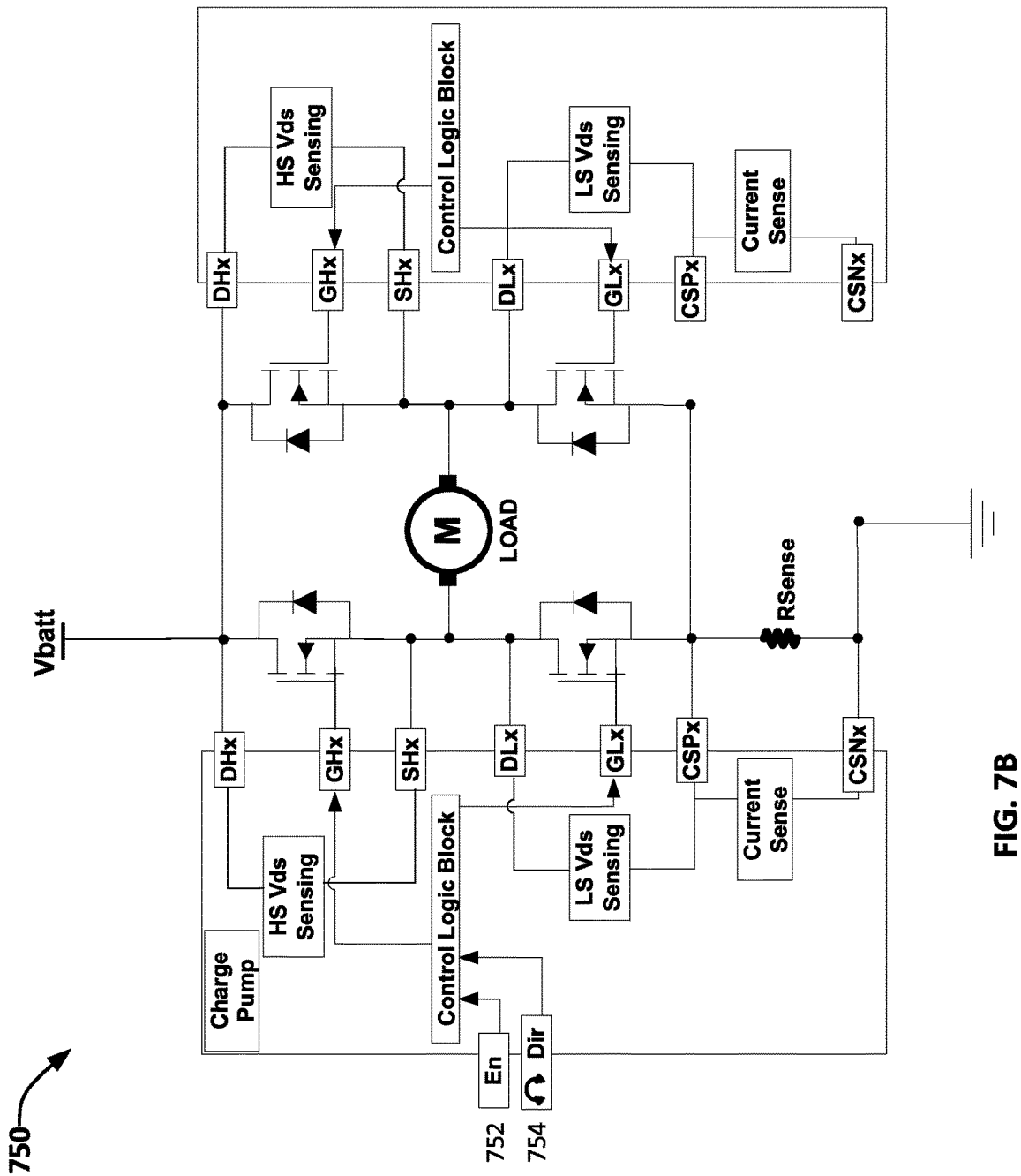
FIG. 7B illustrates circuitry for Mode 5 (HBridge) of the COD ASIC that utilizes a charge pump, in accordance with one embodiment. This mode combines two channels of the COD ASIC.

FIG. 7A illustrates circuitry 700 for Mode 5 (HBridge) of the COD ASIC that utilizes a bootstrap capacitor. FIG. 7B illustrates circuitry 750 for Mode 5 (HBridge) of the COD ASIC that utilizes a charge pump. The various abbreviations (e.g. DHx, etc.) denoted in FIGS. 7A and 7B represent the same elements e.g. DHx, etc.) as described for FIGS. 1-3. Mode 5 combines two channels of the COD ASIC in order to fhjhdr driv drive a motor load. In FIGS. 7A/7B, the En control pin 702/752 and the Dir control pin 704/754 enable and allow a change of direction of the motor by switching appropriate FETs (i.e. FETs A, B, C, and D). For example, when FETs A and D are ON, the motor load can turn in one direction. When the Dir control pin changes state, then FETs A and D are turned off and FETs B and C are turned ON, which causes the turning of the motor load to change direction.

Figure 8A:
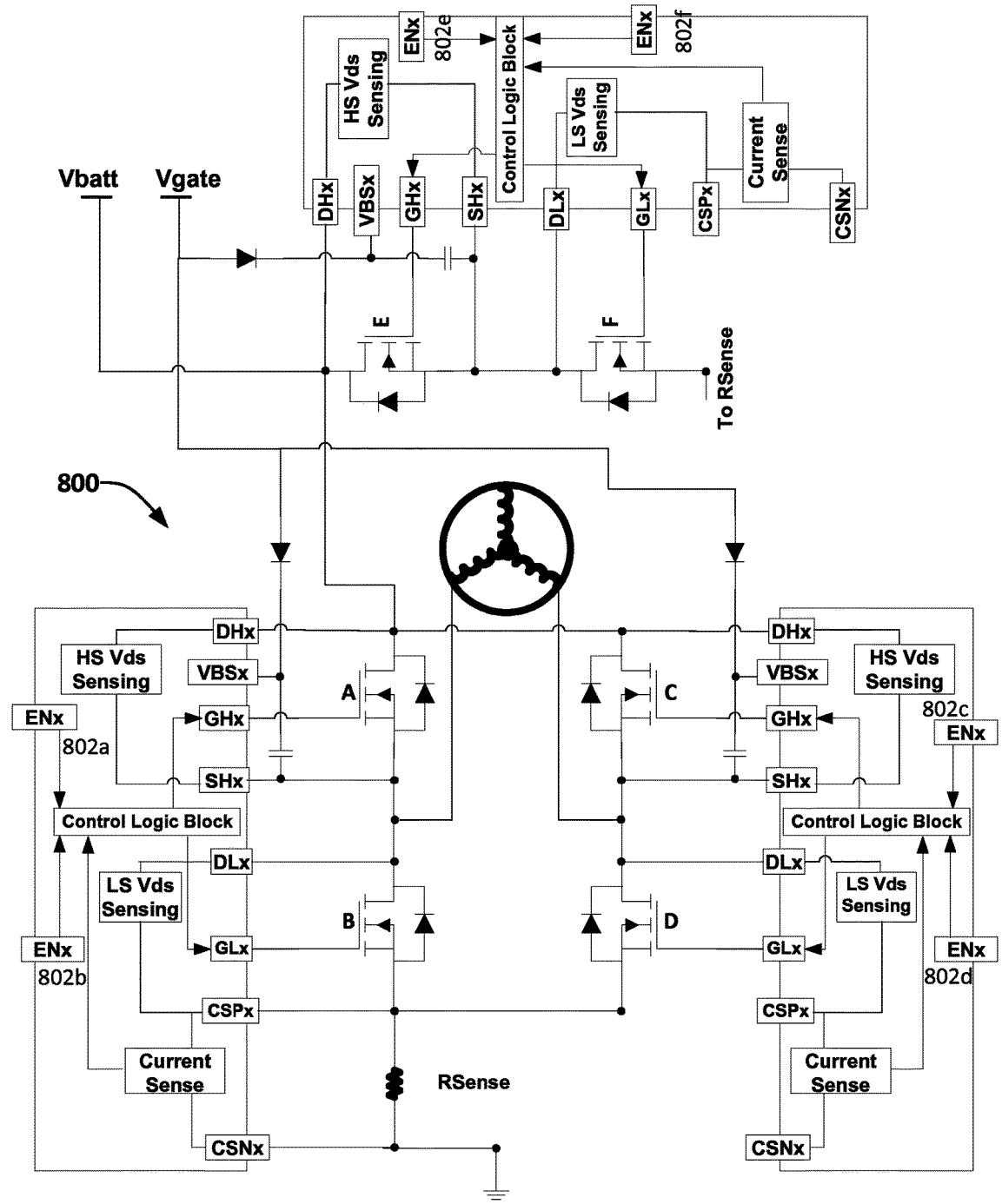
FIG. 8A illustrates circuitry for Mode 6 (Phase Brushless Motor) of the COD ASIC that utilizes a bootstrap capacitor, in accordance with one embodiment. This mode combines three channels of the COD ASIC.
Figure 8B:
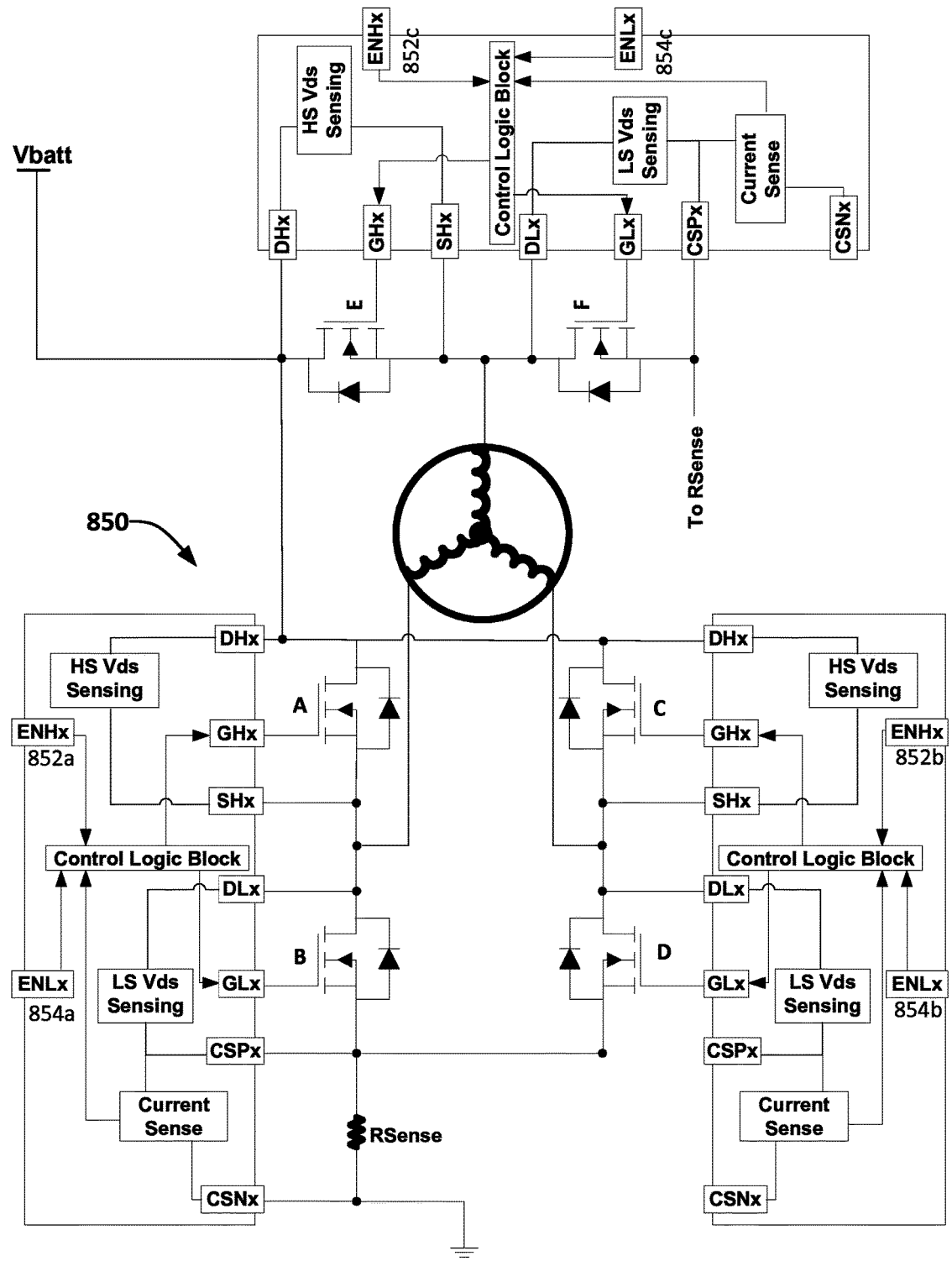
FIG. 8B illustrates circuitry for Mode 6 (Phase Brushless Motor) of the COD ASIC that utilizes a charge pump, in accordance with one embodiment. This mode combines three channels of the COD ASIC.

FIG. 8A illustrates circuitry 800 for Mode 6 (Phase Brushless Motor) of the COD ASIC that utilizes a bootstrap capacitor. FIG. 8B illustrates circuitry 850 for Mode 6 (Phase Brushless Motor) of the COD ASIC that utilizes a charge pump. The various abbreviations (e.g. DHx, etc.) denoted in FIGS. 8A and 8B represent the same elements (e.g. DHx, etc.) as described for FIGS. 1-3. Mode 6 combines three channels of the COD ASIC in order to drive a three-phase brushless motor. Each channel's High-Side FET and Low-Side FET are controlled by an ENx signal (802a, 802b, 802c, 802d, 802e and 802f) FIG. 8A. In FIG. 8B, each channel's High-Side FET and Low-Side FET are controlled by a ENHx signal 852a-b-c and ENLx signal 854a-b-c, respectively. For example, if signal 802a and 802d are ON, then FETs A and D will turn ON. If signal 802b and 802c are ON, then FETs B and C will turn ON. Thus, each of the FETs correspond to their respective enable signals, which can be used to turn the respective FET ON or OFF accordingly.

In one embodiment, the COD ASIC disclosed herein supports modulated boost implementations with a variation in the way a boost modulation reference pulse is generated. The reference ramp pulse can be created using a clocked digital-to-analog converter (DAC), and the clock step size is programmable to accommodate different rise rates to support Cummins CELECT and the HPI-TP fuel systems.

As above described, the present disclosure provides a configurable output driver circuit (a COD ASIC) and logic that allows for the adaptation of ECM outputs to the actuator/motor. The COD ASIC improves system flexibility and eliminates the need to change hardware and to go through the hardware design cycle again by enabling software updates to change channel configurations of the COD ASIC.

Referring to FIGS. 9, 10A-B, and 11A-B, various configurations of an ECM having the COD ASIC disclosed herein are shown. The differences between when the ECM is and is not designed to take advantage of the flexibility of the disclosed COD ASIC are also depicted. The output driver section of the ECM is connected to different loads to describe the differences between whether the pins of the FETS of the ECM are pinned out or not (i.e., whether the ECM has output pins for the high-side/low-side drivers of each channel of the COD ASIC). When the ECM does have corresponding driver pins, the ECM can take advantage of the flexibility of the COD ASIC. If the ECM does not have corresponding pins, then the ECM needs to be specifically designed to drive each type of load, and the flexibility offered by COD ASIC is not utilized. In each of FIGS. 9, 10A-B, and 11A-B, intermediate circuitry may also be required, typically based on a type of load being driven.

Figure 9:
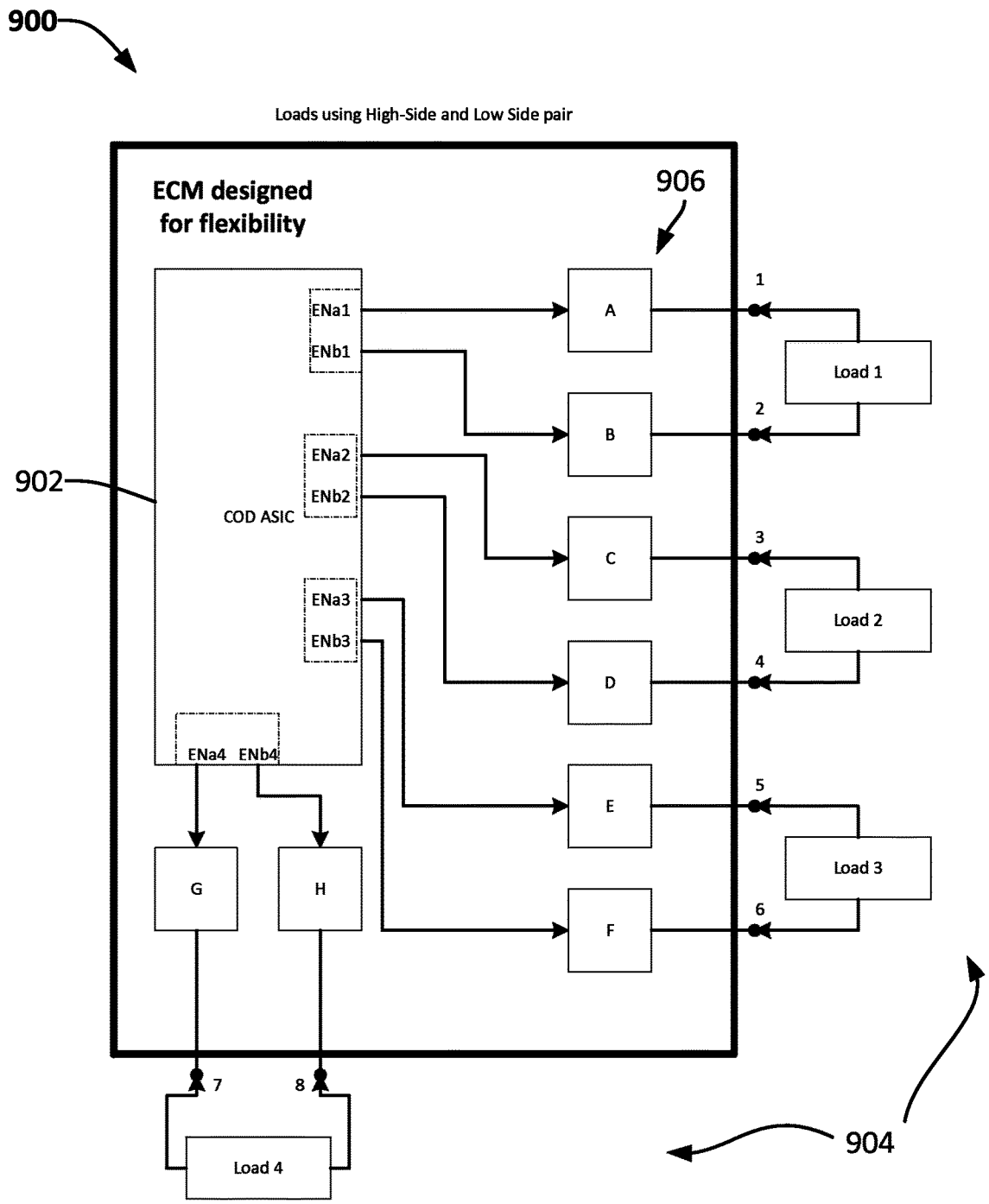
FIG. 9 illustrates an ECM that includes a COD ASIC, in accordance with one embodiment.

Referring to FIG. 9, ECM 900 is designed for flexibility and includes COD ASIC 902. As depicted, ECM 900 is configured to use COD ASIC 902 to drive loads 904, and ECM 900 includes an output driver section 906 that is pinned out. FETs A-B correspond to the high-side/low-side drivers (ENa1/ENb1) of channel 1; FETs C-D correspond to the high-side/low-side drivers (ENa2/ENb2) of channel 2; FETs E-F correspond to the high-side/low-side drivers (ENa3/ENb3) of channel 3; and FETs G-H correspond to the high-side/low-side drivers (ENa4/ENb4) of channel 4. Each of FETs A-H have corresponding output pins. For example, load 1 can be connected to high-side/low-side pins 1/2 of channel 1; load 2 can be connected to high-side/low-side pins 3/4 of channel 2; load 3 can be connected to high-side/low-side pins 5/6 of channel 3; and load 4 can be connected to high-side/low-side pins 7/8 of channel 4.

Figure 10A:
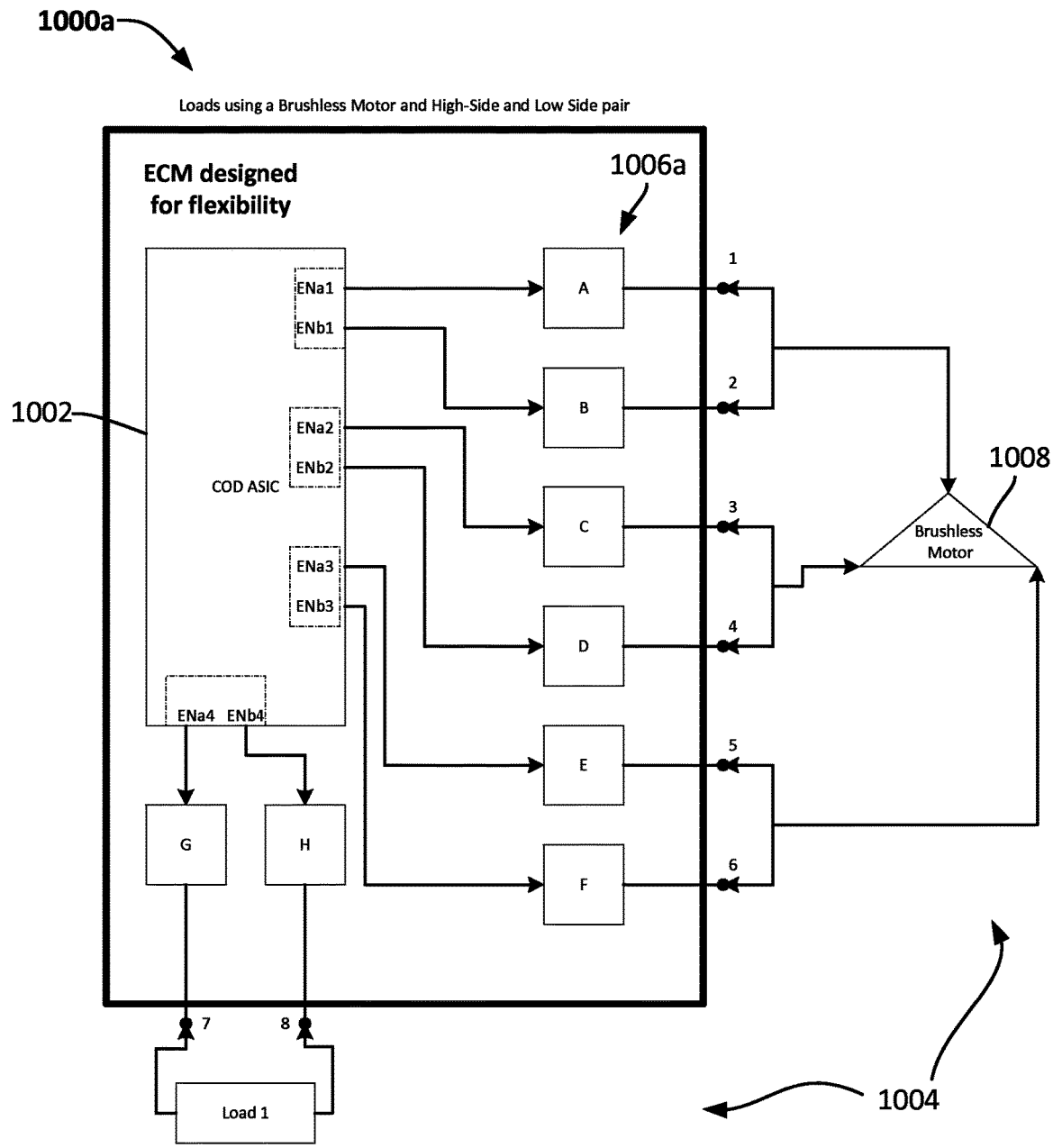
FIG. 10A illustrates an ECM that includes a COD ASIC, in accordance with one embodiment.

Referring to FIG. 10a, ECM 1000a is designed for flexibility and includes COD ASIC 1002. As depicted, ECM 1000a is configured to use COD ASIC 1002 to drive loads 1004, which include Load 1 and a brushless motor. ECM 1000a includes an output driver section 1006a that is pinned out. FETs A-B correspond to the high-side/low-side drivers (ENa1/ENb1) of channel 1; FETs C-D correspond to the high-side/low-side drivers (ENa2/ENb2) of channel 2; FETs E-F correspond to the high-side/low-side drivers (ENa3/ENb3) of channel 3; and FETs G-H correspond to the high-side/low-side drivers (ENa4/ENb4) of channel 4. Each of FETs A-H have corresponding output pins. For example, pins 1-6 can be configured to drive a brushless motor 1008 (e.g., a three-phase brushless motor, etc.) or drive independent loads like FIG. 9. Load 1 can be independently driven by ECM 1000a, and can be connected to high-side/low-side pins 7/8 of channel 4.

Figure 10B:
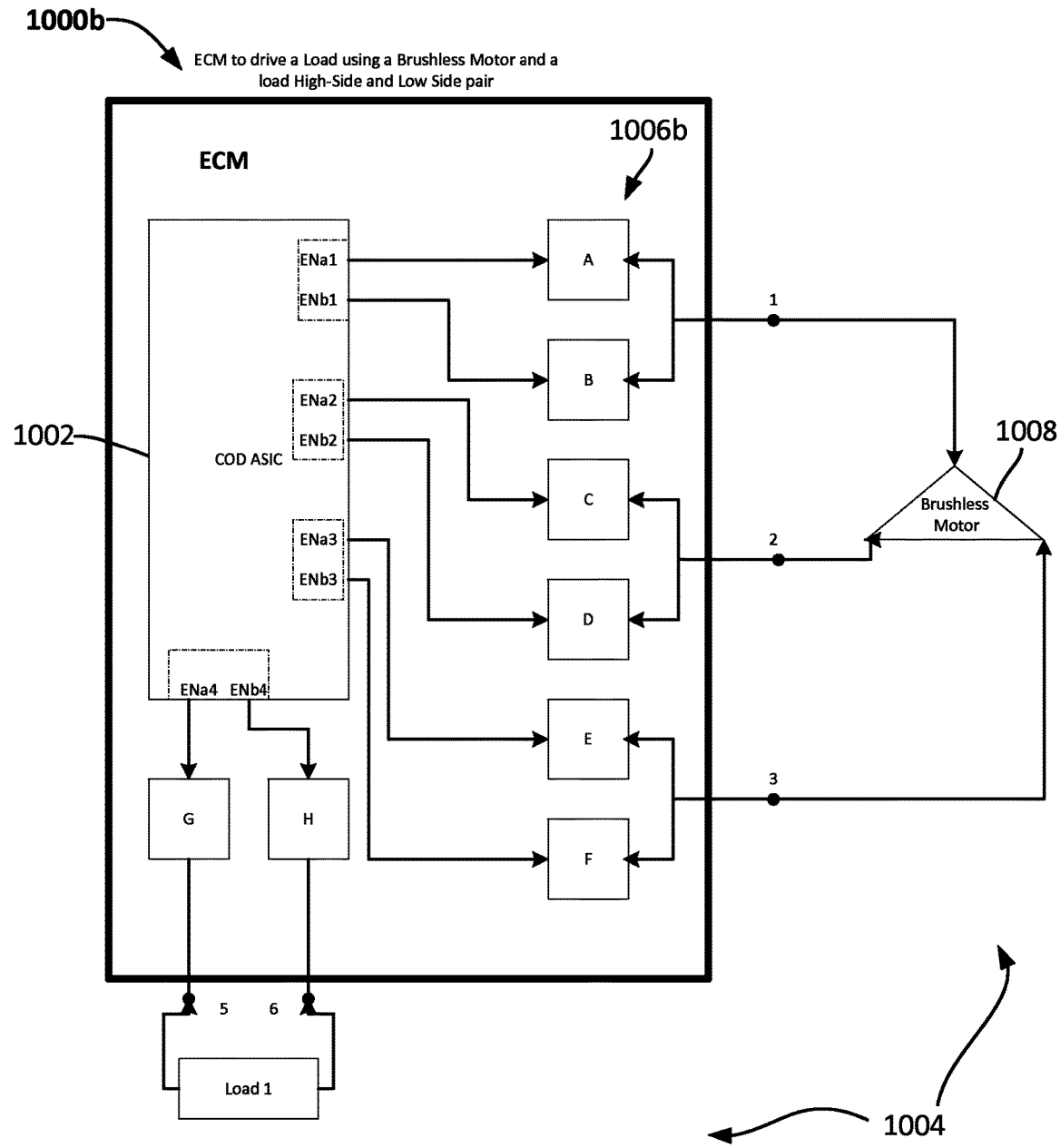
FIG. 10B illustrates an ECM that includes a COD ASIC, in accordance with one embodiment.

Referring to FIG. 10b, ECM 1000b is less flexible than ECM 1000a, and includes COD ASIC 1002. As depicted, ECM 1000b is configured to use COD ASIC 1002 to drive loads 1004, which include Load 1 and a brushless motor. However, ECM 1000b includes an output driver section 1006b that is not pinned out. FETs A-B correspond to the high-side/low-side drivers (ENa1/ENb1) of channel 1; FETs C-D correspond to the high-side/low-side drivers (ENa2/ENb2) of channel 2; FETs E-F correspond to the high-side/low-side drivers (ENa3/ENb3) of channel 3; and FETs G-H correspond to the high-side/low-side drivers (ENa4/ENb4) of channel 4. FETs A-B, C-D, and E-F correspond to output pins 1, 2, and 3, respectively. FETs G-H have corresponding output pins 5/6. In an example configuration, pins 1-3 can be configured to drive a brushless motor 1008, and load 1 can be independently driven by connecting it to high-side/low-side pins 5/6 of channel 4. However, as ECM 1000b is not pinned out, additional components and/or logic is required to be included within ECM 1000b to control the outputs of FETs A-F and to drive any other type of loads than drive brushless motor 1008 using only pins 1-3 (as opposed to having six available pins 1-6, as depicted for ECM 1000a).

Figure 11A:
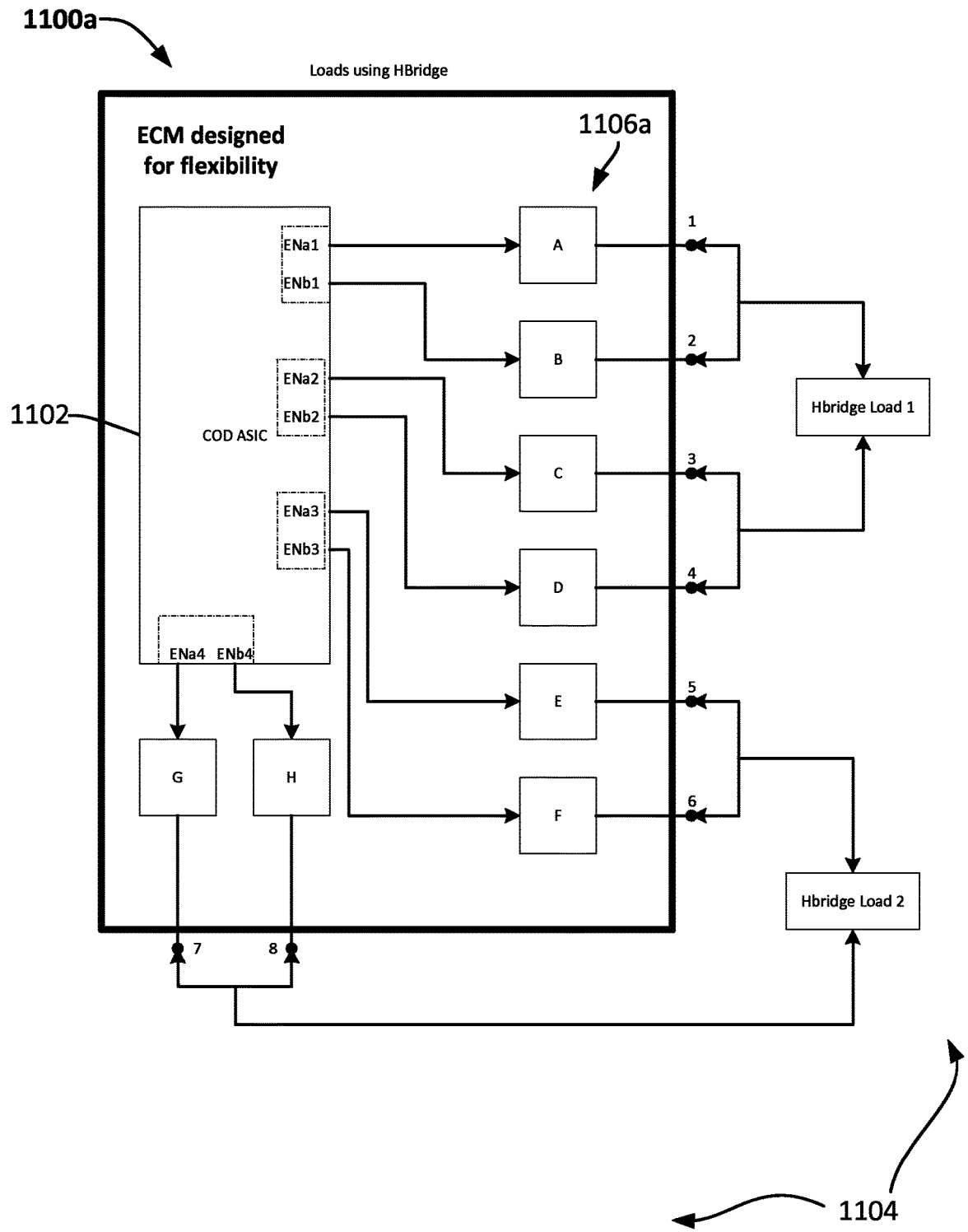
FIG. 11A illustrates an ECM that includes a COD ASIC, in accordance with one embodiment.

Referring to FIG. 11a, ECM 1100a is designed for flexibility and includes COD ASIC 1102. As depicted, ECM 1100a is configured to use COD ASIC 1102 to drive loads 1104, which include Hbridge Loads 1 and 2. ECM 1100a includes an output driver section 1106a that is pinned out. FETs A-B correspond to the high-side/low-side drivers (ENa1/ENb1) of channel 1; FETs C-D correspond to the high-side/low-side drivers (ENa2/ENb2) of channel 2; FETs E-F correspond to the high-side/low-side drivers (ENa3/ENb3) of channel 3; and FETs G-H correspond to the high-side/low-side drivers (ENa4/ENb4) of channel 4. Each of FETs A-H have corresponding output pins. For example, pins 1-4 and pins 5-8 can be configured to drive Hbridge Loads 1 and 2, respectively.

Figure 11B:
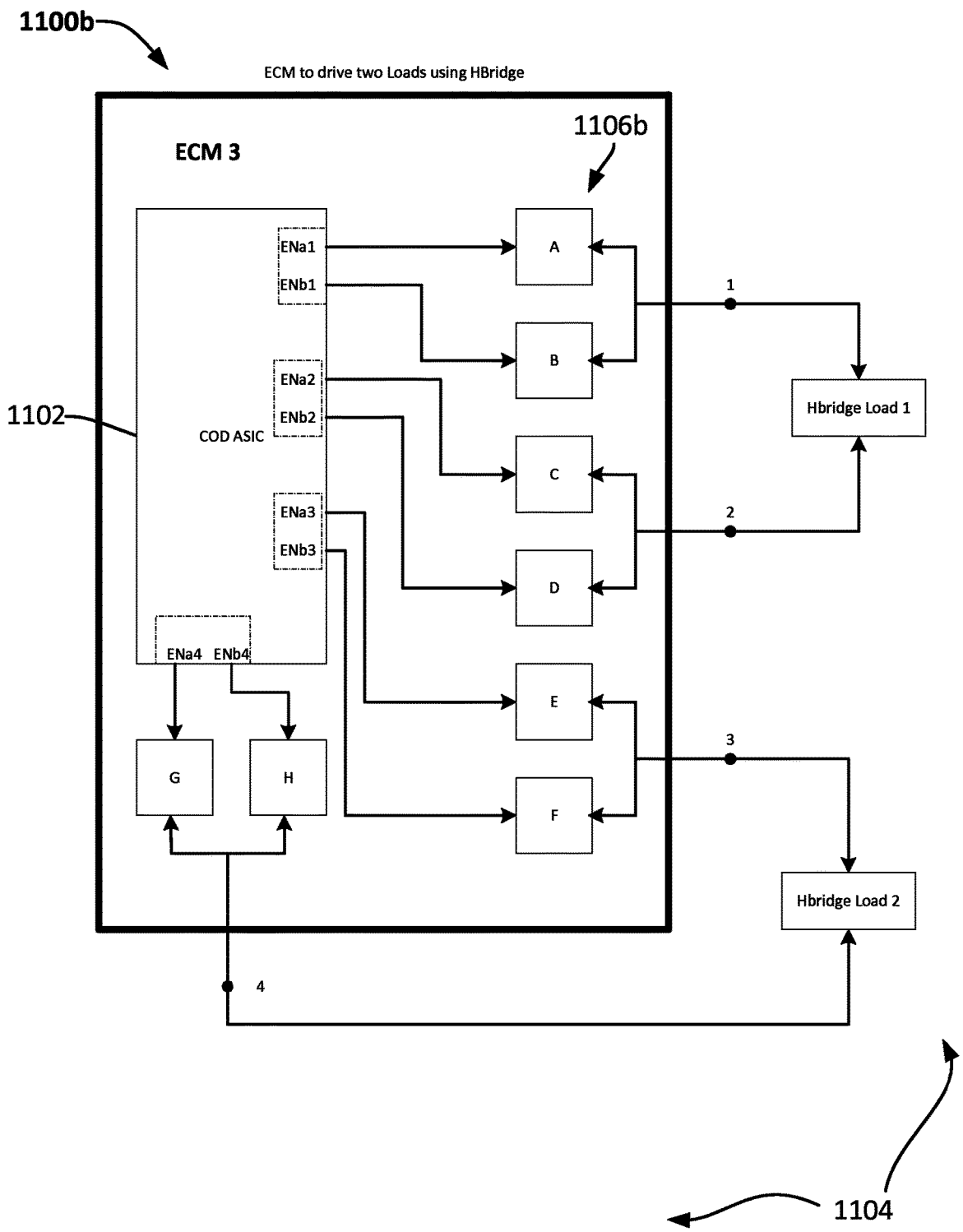
FIG. 11B illustrates an ECM that includes a COD ASIC, in accordance with one embodiment.

Referring to FIG. 11b, ECM 1100b is less flexible than ECM 1100a, and includes COD ASIC 1102. As depicted, ECM 1100b is configured to use COD ASIC 1102 to drive loads 1104, which include Hbridge Loads 1 and 2. However, ECM 1100b includes an output driver section 1106b that is not pinned out. FETs A-B correspond to the high-side/low-side drivers (ENa1/ENb1) of channel 1; FETs C-D correspond to the high-side/low-side drivers (ENa2/ENb2) of channel 2; FETs E-F correspond to the high-side/low-side drivers (ENa3/ENb3) of channel 3; and FETs G-H correspond to the high-side/low-side drivers (ENa4/ENb4) of channel 4. FETs A-B, C-D, E-F, and G-H correspond to output pins 1, 2, 3, and 4 respectively. However, as ECM 1100b is not pinned out, additional components and/or logic is required to be included within ECM 1100b to control the outputs of FETs A-H and to properly drive any other loads other than Hbridge. Loads 1 and 2 using only pins 1-4 (as opposed to having eight available pins 1-8, as depicted for ECM 1100a).

Figure 12:
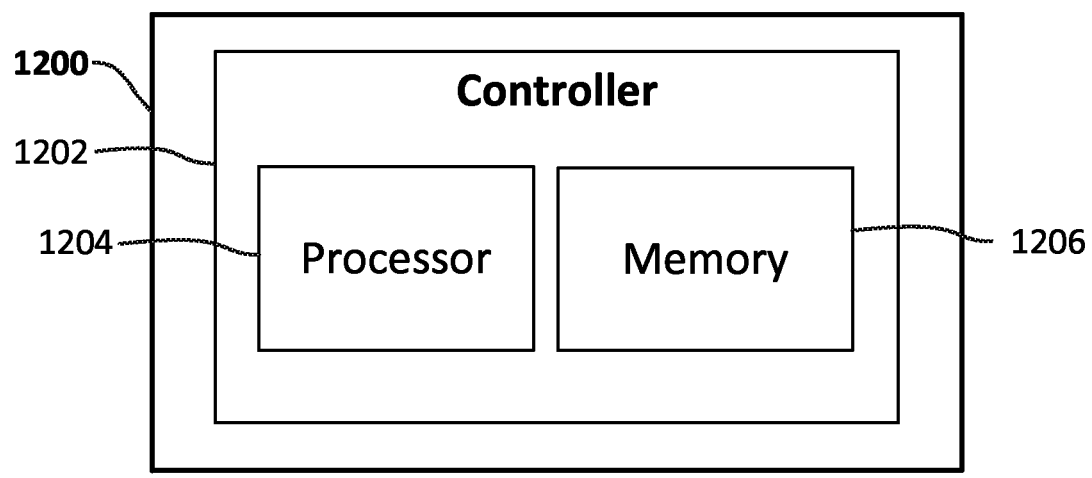
FIG. 12 illustrates a system for implementing the techniques and methods described herein.

Embodiments described herein can take the form of a hardware implementation, a software implementation, or an implementation containing both hardware and software elements. Referring to FIG. 12, a system 1200 is shown that may be used to implement or model the functionality described herein. System 1200 typically includes a controller 1202 having at least one processor 1204 coupled to a memory 1206. Processor 1204 may represent one or more processors and may be implemented as the COD ASIC disclosed herein. Processor 1204 may also include general-purpose processor, an application specific integrated circuit, one or more field programmable gate arrays (FPGAs), a digital-signal-processor (DSP), a group of processing components, other suitable electronic processing components, or any commercially available CPU. Memory 1206 may include random access memory (RAM) devices comprising a main storage of the controller 1202, as well as any supplemental levels of memory, e.g., cache memories, non-volatile or back-up memories (e.g., programmable or flash memories), registers, read-only memories, etc. In addition, memory 1206 may include memory storage physically located elsewhere in system 1200 or controller 1202, e.g., any cache memory in the processor 1204 as well as any storage capacity used as a virtual memory, e.g., as stored on a mass storage device, etc.

In certain embodiments, controller 1202 forms a portion of a processing subsystem including one or more computing devices having memory, processing, and communication hardware. Controller 1202 may be a single device or a distributed device, and the functions of controller 1202 may be performed by hardware and/or as computer instructions on a non-transient computer readable storage medium, and functions may be distributed across various hardware or computer based components.

In general, the routines executed to implement the embodiments may be implemented as part of an operating system or a specific application, module, or sequence of instructions. In certain embodiments, controller 1202 includes one or more modules structured to functionally execute the operations of controller 1202. The description herein including modules emphasizes the structural independence of the aspects of the controller 1202, and illustrates one grouping of operations and responsibilities of the controller 1202. Other groupings that execute similar overall operations are understood within the scope of the present application. The modules typically comprise one or more instructions set at various times in various memory and storage devices in a computer, and that, when read and executed by one or more processors in a computer, cause the computer to perform operations necessary to execute elements of disclosed embodiments. Moreover, various embodiments have been described in the context of fully functioning computers and computer systems, those skilled in the art will appreciate that the various embodiments are capable of being distributed as a program product in a variety of forms, and that this applies equally regardless of the particular type of computer-readable media used to actually effect the distribution. Examples of computer-readable media include but are not limited to recordable type media such as volatile and non-volatile memory devices, floppy and other removable disks, hard disk drives, optical disks, flash memory, among others.

In the above description numerous specific details are set forth for purposes of explanation. It will be apparent, however, to one skilled in the art that these specific details are merely examples. In other instances, structures and devices are shown only in block diagram form in order to avoid obscuring the teachings.

Reference in this specification to "one embodiment" or "an embodiment" means that a particular feature, structure, or characteristic described in connection with the embodiment is included in at least one embodiment. The appearance of the phrase "in one embodiment" in various places in the specification is not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

While certain exemplary embodiments have been described and shown in the accompanying drawings, it is to be understood that such embodiments are merely illustrative and not restrictive of the disclosed embodiments and that these embodiments are not limited to the specific constructions and arrangements shown and described, since various other modifications may occur to those ordinarily skilled in the art upon studying this disclosure. In an area of technology such as this, where growth is fast and further advancements are not easily foreseen, the disclosed embodiments may be readily modifiable in arrangement and detail as facilitated by enabling technological advancements without departing from the principals of the present disclosure.

What is claimed is:

1. A fuel system, comprising:
an electronic control module (ECM);
at least one injector coupled to the ECM; and
a configurable output driver circuit coupled to the at least one injector, wherein the configurable output driver circuit comprises a channel that enables adaptation of ECM outputs, wherein the channel includes a high-side and a low-side, wherein in response to a load current being at or above a predefined limit, the high side is deactivated.

2. The fuel system of claim 1, wherein the configurable output driver circuit comprises a configurable output driver application-specific integrated circuit (COD ASIC).

3. The fuel system of claim 2, wherein the COD ASIC is configurable based on a value stored in a register of the ASIC.

4. The fuel system of claim 3, wherein the channel comprises a boost drive.

5. The fuel system of claim 4, wherein the channel comprises a bootstrap capacitor to create a drive required for the high-side.

6. The fuel system of claim 4, wherein the channel comprises a charge pump to create a drive required for the high-side.

7. The fuel system of claim 4, wherein the high-side and low-side drive an un-boosted voltage injector type (solenoid) load.

8. The fuel system of claim 4, wherein the high-side and low-side combined with the boost drive drives a boosted voltage injector type (solenoid) load.

9. The fuel system of claim 4, wherein the channel is a first channel, and wherein the configurable output driver circuit further comprises a second channel, and wherein the second channel comprises a second high-side and low-side pair and a second PFET boost drive.

10. The fuel system of claim 9, wherein the second channel is configurable based on a second value stored in a second register of the ASIC.

11. The fuel system of claim 10, wherein the configurable output driver circuit includes at least one of a boosted solenoid configuration, an HBridge (HB) driver configuration, a brushless motor (BM) driver configuration, an independent High-Side (HS) driver configuration, and an independent Low-Side (LS) driver configuration.

12. The fuel system of claim 10, wherein output of the first and second channels is combined to drive a single load.

13. The fuel system of claim 2, wherein the COD ASIC supports modulated boost by creating a reference ramp pulse by a clocked digital-to-analog converter (DAC).

14. A configurable output driver circuit, comprising:
a plurality of channels configured to drive at least one load, wherein each channel comprises:
a high-side (HS) drive;
a low-side (LS) drive; and
a boost drive; and
at least one register configured to store configuration information for the plurality of channels, wherein the configuration information specifies a mode of operation for each of the plurality of channels, wherein in response to a load current being at or above a predefined limit, the high side drive is deactivated.

15. The configurable output driver circuit of claim 14, wherein each of the plurality of channels is individually configurable based on the configuration information.

16. The configurable output driver circuit of claim 14, wherein at least one of the plurality of channels is configured to drive a boosted voltage Injector-type load.

17. The configurable output driver circuit of claim 14, wherein at least two of the plurality of channels are configured to form a combined driver signal.

18. The configurable output driver circuit of claim 14, wherein the combined driver signal is configured to drive at least one of an HBridge (HB) load, a brushless motor (BM) load, and an independent High-Side (HS) load, and an independent Low-Side (LS) load.

19. A method for adapting an electronic control module (ECM) output, comprising:
coupling at least one injector to the ECM; and
coupling a configurable output driver circuit to the at least one injector, wherein the configurable output driver circuit comprises:
a plurality of channels configured to drive at least one load; and
at least one register configured to store configuration information for the plurality of channels, wherein the configuration information specifies a mode of operation for each of the plurality of channels, wherein each channel in the plurality of channels includes a high-side and a low-side, wherein in response to a load current being at or above a predefined limit, the high side of at least one channel is deactivated.

20. The method of claim 19, further comprising providing configuration information to the at least one register in order to specify a particular mode of operation for one or more of the plurality of channels.

21. The method of claim 20, wherein the particular mode of operation is based on a type of load driven by the one or more of the plurality of channels.

22. The method of claim 21, wherein each of the plurality of channels comprises
a boost drive.

* * * * *